(12) United States Patent
Hong et al.

(10) Patent No.: US 12,490,567 B2
(45) Date of Patent: Dec. 2, 2025

(54) DISPLAY DEVICE

(71) Applicant: Samsung Display Co., Ltd., Yongin-si (KR)

(72) Inventors: Kwang Taek Hong, Seoul (KR); Hong Joon Moon, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 655 days.

(21) Appl. No.: 17/449,924

(22) Filed: Oct. 4, 2021

(65) Prior Publication Data

US 2022/0293668 A1   Sep. 15, 2022

(30) Foreign Application Priority Data

Mar. 9, 2021   (KR) .......................... 10-2021-0030551

(51) Int. Cl.
*H10H 29/14* (2025.01)
*H10H 20/01* (2025.01)
*H10H 20/821* (2025.01)
*H10H 20/831* (2025.01)
(Continued)

(52) U.S. Cl.
CPC .......... *H10H 29/142* (2025.01); *H10H 20/01* (2025.01); *H10H 20/821* (2025.01); *H10H 20/831* (2025.01); *H10H 20/832* (2025.01); *H10H 20/84* (2025.01); *H10H 20/032* (2025.01)

(58) Field of Classification Search
CPC ..... H01L 33/00–648; H01L 27/15–156; H01L 2933/00–0091; H01L 33/62; H01L 33/647; H10K 50/805–828; H10K 59/122; H10H 20/00–882; H10H 29/00–142; H10H 29/30–962
See application file for complete search history.

(56) References Cited

U.S. PATENT DOCUMENTS

| 10,461,123 B2 | 10/2019 | Kim et al. |
| 11,114,500 B2 | 9/2021 | Lee et al. |
| 11,581,363 B2 | 2/2023 | Kim et al. |

(Continued)

FOREIGN PATENT DOCUMENTS

| KR | 10-1537492 B1 | 7/2015 |
| KR | 20180072909 A | 7/2018 |

(Continued)

OTHER PUBLICATIONS

Korean Office Action for KR Application No. 10-2021-0030551, dated Feb. 3, 2025, 5 pages.

*Primary Examiner* — Matthew C Landau
*Assistant Examiner* — Nora T. Nix
(74) *Attorney, Agent, or Firm* — Womble Bond Dickinson (US) LLP

(57) ABSTRACT

A display device including a substrate, a bank pattern extending in a first direction on the substrate, a first electrode on the bank pattern, a second electrode on the substrate, a first insulating layer on the first electrode and the second electrode, a light emitting element on the first insulating layer, and including a first end on the first electrode, and a second end on the second electrode, a first connection electrode contacting the first end of the light emitting element, and a second connection electrode contacting the second end of the light emitting element, wherein the bank pattern overlaps the first electrode and does not overlap the second electrode.

19 Claims, 21 Drawing Sheets

(51) Int. Cl.
 *H10H 20/832* (2025.01)
 *H10H 20/84* (2025.01)

(56) References Cited

U.S. PATENT DOCUMENTS

| | | | |
|---|---|---|---|
| 12,119,372 B2 | 10/2024 | Kim et al. | |
| 2013/0168708 A1* | 7/2013 | Shibata | H01L 24/95 |
| | | | 257/88 |
| 2018/0175106 A1* | 6/2018 | Kim | H10H 20/84 |
| 2019/0319168 A1* | 10/2019 | Kim | H01L 33/50 |
| 2020/0075667 A1* | 3/2020 | Lee | H10H 20/83 |
| 2021/0399043 A1 | 12/2021 | Lee et al. | |
| 2022/0173160 A1* | 6/2022 | Pak | H01L 29/78633 |
| 2025/0040330 A1 | 1/2025 | Kim et al. | |

FOREIGN PATENT DOCUMENTS

| | | |
|---|---|---|
| KR | 10-2019-0026351 A | 3/2019 |
| KR | 10-2020-0008837 A | 1/2020 |
| KR | 10-2020-0010706 A | 1/2020 |
| KR | 20200028065 A | 3/2020 |
| KR | 10-2020-0105775 A | 9/2020 |
| WO | WO 2021/235589 A1 | 11/2021 |

\* cited by examiner

DISPLAY DEVICE

CROSS-REFERENCE TO RELATED APPLICATION

This application claims priority to, and the benefit of, Korean Patent Application No. 10-2021-0030551, filed on Mar. 9, 2021, in the Korean Intellectual Property Office, the disclosure of which is incorporated herein in its entirety by reference.

BACKGROUND

1. Field

The present disclosure relates to a display device.

2. Description of the Related Art

Display devices are becoming increasingly important with the development of multimedia. Accordingly, various types of display devices, such as organic light emitting displays and liquid crystal displays are being used.

A display device may include a display panel, such as an organic light emitting display panel or a liquid crystal display panel, as a device for displaying an image of the display device. Among them, a light emitting display panel may include light emitting elements, such as light emitting diodes (LEDs). For example, the LEDs may be organic LEDs using an organic material as a fluorescent material, or may be inorganic LEDs using an inorganic material as the fluorescent material.

SUMMARY

Aspects of the present disclosure provide a display device having improved light efficiency and alignment degree of light emitting elements.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some embodiments of the present disclosure, the display device includes a substrate, a bank pattern extending in a first direction on the substrate, a first electrode on the bank pattern, a second electrode on the substrate, a first insulating layer on the first electrode and the second electrode, a light emitting element on the first insulating layer, and including a first end on the first electrode, and a second end on the second electrode, a first connection electrode contacting the first end of the light emitting element, and a second connection electrode contacting the second end of the light emitting element, wherein the bank pattern overlaps the first electrode and does not overlap the second electrode.

A width of the second electrode in a second direction crossing the first direction may be greater than a width of the first electrode in the second direction.

The width of the second electrode may be about 1.5 to about 3 times the width of the first electrode.

An area of the second electrode may be larger than an area of the first electrode.

The light emitting element may include a light emitting layer adjacent to the first electrode.

The display device may further include a via layer between the substrate and the second electrode, wherein an entire lower surface of the second electrode contacts the via layer.

The first electrode and the second electrode may include a ferroelectric.

The ferroelectric may include at least one of PZT, SBT, and BLT.

According to some embodiments of the present disclosure, the display device includes a substrate, a first electrode and a second electrode on the substrate, extending in a first direction, and spaced apart from each other, a first insulating layer on the first electrode and the second electrode, a light emitting element on the first insulating layer, and including a first end on the first electrode, and a second end on the second electrode, a first connection electrode contacting the first end of the light emitting element, and a second connection electrode contacting the second end of the light emitting element, wherein a width of the second electrode in a second direction crossing the first direction is greater than a width of the first electrode in the second direction.

The width of the second electrode may be about 1.5 to about 3 times the width of the first electrode.

An area of the second electrode may be larger than an area of the first electrode.

The display device may further include a bank pattern between the substrate and the first electrode, and overlapping the first electrode while not overlapping the second electrode.

The light emitting element may include a light emitting layer adjacent to the first electrode.

The first electrode and the second electrode may include a ferroelectric including at least one of PZT, SBT, and BLT.

According to some embodiments of the present disclosure, the display device includes a first electrode, a second electrode, and a third electrode on a substrate, extending in a first direction, and spaced apart from each other, a first insulating layer on the first electrode, the second electrode, and the third electrode, a first light emitting element on the first insulating layer, and including a first end on the first electrode, and a second end on the second electrode, a second light emitting element on the first insulating layer, and including a first end on the first electrode and, a second end on the third electrode, a first connection electrode contacting the first end of the first light emitting element and the first end of the second light emitting element, a second connection electrode contacting the second end of the first light emitting element, and a third connection electrode contacting the second end of the second light emitting element, wherein a width of each of the second electrode and the third electrode in a second direction crossing the first direction is greater than a width of the first electrode in the second direction.

The width of each of the second electrode and the third electrode may be about 1.5 to about 3 times the width of the first electrode.

An area of each of the second electrode and the third electrode may be larger than an area of the first electrode.

The display device may further include a bank pattern between the substrate and the first electrode, and overlapping the first electrode while not overlapping the second electrode and the third electrode.

Each of the first light emitting element and the second light emitting element may include a light emitting layer adjacent to the first electrode.

The first electrode, the second electrode, and the third electrode may include a ferroelectric including at least one of PZT, SBT, and BLT.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
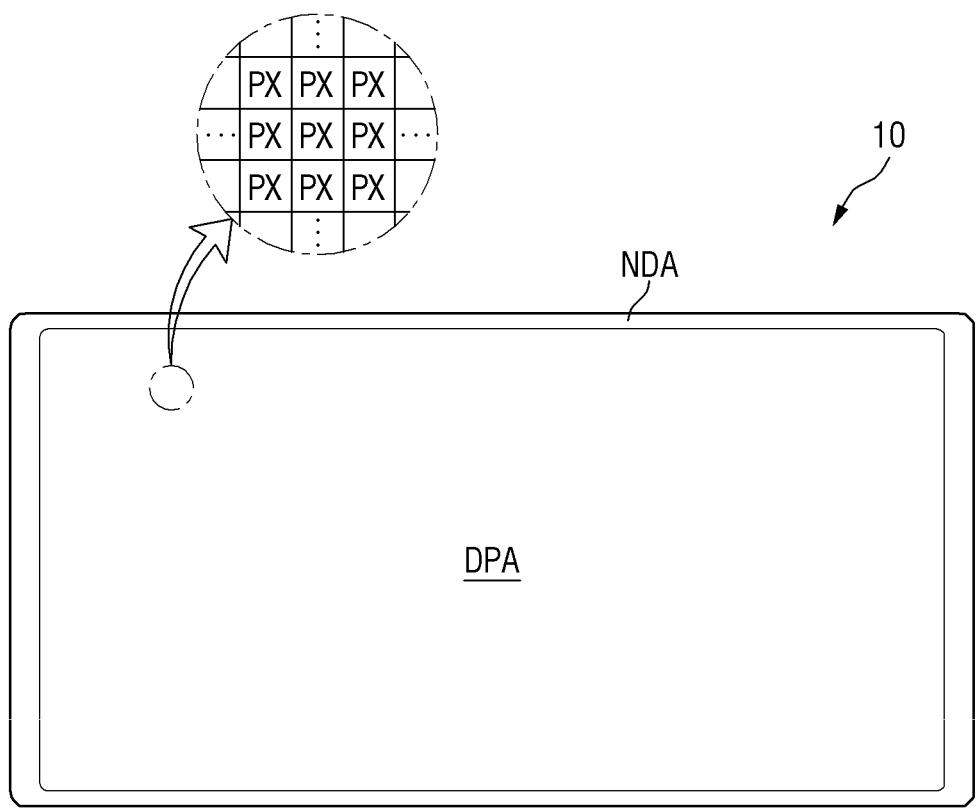
FIG. 1 is a schematic plan view of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Each of the features of the various embodiments of the present disclosure may be combined or combined with each other, in part or in whole, and technically various interlocking and driving are possible. Each embodiment may be implemented independently of each other or may be implemented together in an association.

FIG. 1 is a schematic plan view of a display device 10 according to some embodiments.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, and camcorders, all of which provide a display screen.

The display device 10 may include a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the present disclosure is not limited to this case, and other display panels can also be applied as long as the same technical spirit is applicable.

In the drawings for describing the display device 10, a first direction DR1, a second direction DR2, and a third direction DR3 are defined. The first direction DR1 and the second direction DR2 may be directions substantially perpendicular to each other in one plane. The third direction DR3 may be a direction that is substantially perpendicular to the plane in which the first direction DR1 and the second direction DR2 are located. The third direction DR3 is substantially perpendicular to each of the first direction DR1 and the second direction DR2. In embodiments for describing the display device 10, the third direction DR3 indicates a thickness direction of the display device 10.

The shape of the display device 10 can be variously modified. For example, the display device 10 may be shaped like a rectangle that is longer in the first direction DR1 than in the second direction DR2 in plan view. For another example, the display device 10 may be shaped like a rectangle that is longer in the second direction DR2 than in the first direction DR1 in plan view. However, the present disclosure is not limited thereto, and the display device 10 may also have various shapes, such as a square, a quadrangle with rounded corners (vertices), other polygons, and a circle. The shape of a display area DPA of the display device 10 may also be similar to the overall shape of the display device 10. In FIG. 1, each of the display device 10 and the display area DPA is shaped like a rectangle that is longer in the first direction DR1 than in the second direction DR2.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy the center of the display device 10.

The display area DPA may include a plurality of pixels PX. The pixels PX may be arranged in a matrix direction. Each of the pixels PX may be rectangular or square in plan view. However, the present disclosure is not limited thereto, and each of the pixels PX may also have a rhombus shape having each side inclined with respect to a direction. The pixels PX may be alternately arranged in a stripe type or a PENTILE® type (e.g., a PENTILE® matrix structure, a PENTILE® structure, or an RGBG structure). PENTILE® is a registered trademark of Samsung Display Co., Ltd., Republic of Korea. In addition, each of the pixels PX may display a corresponding color by including one or more light emitting elements that emit light of a specific wavelength band.

The non-display area NDA may be located around the display area DPA. The non-display area NDA may entirely or partially surround the display area DPA. The display area DPA may be rectangular, and the non-display area NDA may be located adjacent to four sides of the display area DPA. The non-display area NDA may form a bezel of the display device 10. Wirings or circuit drivers included in the display device 10 may be located, or external devices may be mounted, in non-display area NDA.

Figure 2:
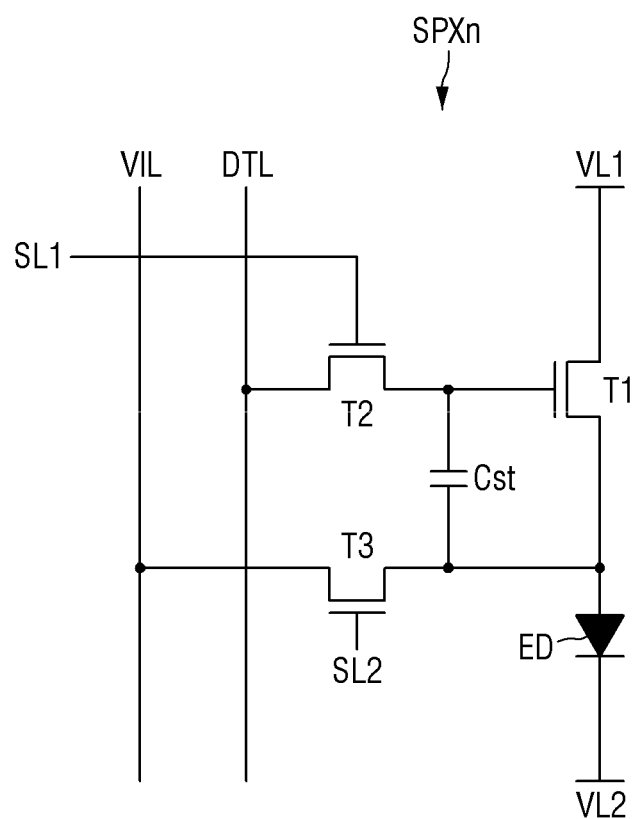
FIG. 2 is an equivalent circuit diagram of a subpixel of the display device according to some embodiments.

FIG. 2 is an equivalent circuit diagram of a subpixel SPXn of the display device 10 according to some embodiments.

Referring to FIG. 2, each subpixel SPXn of the display device 10 according to some embodiments may include three transistors T1 through T3 and one storage capacitor Cst in addition to a light emitting element ED.

The light emitting element ED emits light according to a current supplied through a first transistor T1. The light emitting element ED may emit light of a corresponding wavelength band in response to electrical signals received from a first electrode and a second electrode connected to respective ends thereof.

A first end of the light emitting element ED may be connected to a source electrode of the first transistor T1, and a second end of the light emitting element ED may be connected to a second voltage line VL2 to which a low potential voltage (hereinafter, referred to as a second power supply voltage), which is lower than a high potential voltage (hereinafter, referred to as a first power supply voltage) of a first voltage line VL1, is supplied.

The first transistor T1 adjusts a current flowing from the first voltage line VL1, to which the first power supply voltage is supplied, to the light emitting element ED according to a voltage difference between a gate electrode and the source electrode. For example, the first transistor T1 may be a driving transistor for driving the light emitting element ED. The first transistor T1 may have the gate electrode connected to a source electrode of a second transistor T2, the source electrode connected to the first end of the light emitting element ED, and a drain electrode connected to the first voltage line VL1 to which the first power supply voltage is applied.

The second transistor T2 is turned on by a scan signal of a first scan line SL1 to connect a data line DTL to the gate electrode of the first transistor T1. The second transistor T2 may have a gate electrode connected to the first scan line SL1, the source electrode connected to the gate electrode of the first transistor T1, and a drain electrode connected to the data line DTL.

A third transistor T3 is turned on by a scan signal of a second scan line SL2 to connect an initialization voltage line VIL to the first end of the light emitting element ED. The third transistor T3 may have a gate electrode connected to the second scan line SL2, a drain electrode connected to the initialization voltage line VIL, and a source electrode connected to the first end of the light emitting element ED and/or to the source electrode of the first transistor T1. Although the first scan line SL1 and the second scan line SL2 are illustrated separately in the drawing, the present disclosure is not limited thereto. In some embodiments, the first scan line SL1 and the second scan line SL2 may be formed as a single line. In this case, the second transistor T2 and the third transistor T3 may be simultaneously turned on by the same scan signal.

In some embodiments, the source electrode and the drain electrode of each of the transistors T1 through T3 are not limited to the above description, and the opposite may also be the case. In addition, each of the transistors T1 through T3 may be formed as a thin-film transistor. In addition, although each of the transistors T1 through T3 is mainly described as an N-type metal oxide semiconductor field effect transistor (MOSFET) in FIG. 2, the present disclosure is not limited thereto. That is, each of the transistors T1 through T3 may also be formed as a P-type MOSFET, or one or more of the transistors T1 through T3 may be formed as N-type MOSFETs, and the other(s) may be formed as a P-type MOSFET.

The storage capacitor Cst is formed between the gate electrode and the source electrode of the first transistor T1. The storage capacitor Cst stores a difference between a gate voltage and a source voltage of the first transistor T1.

The structure of a pixel PX of the display device 10 according to some embodiments will now be described in detail with further reference to other drawings.

Figure 3:
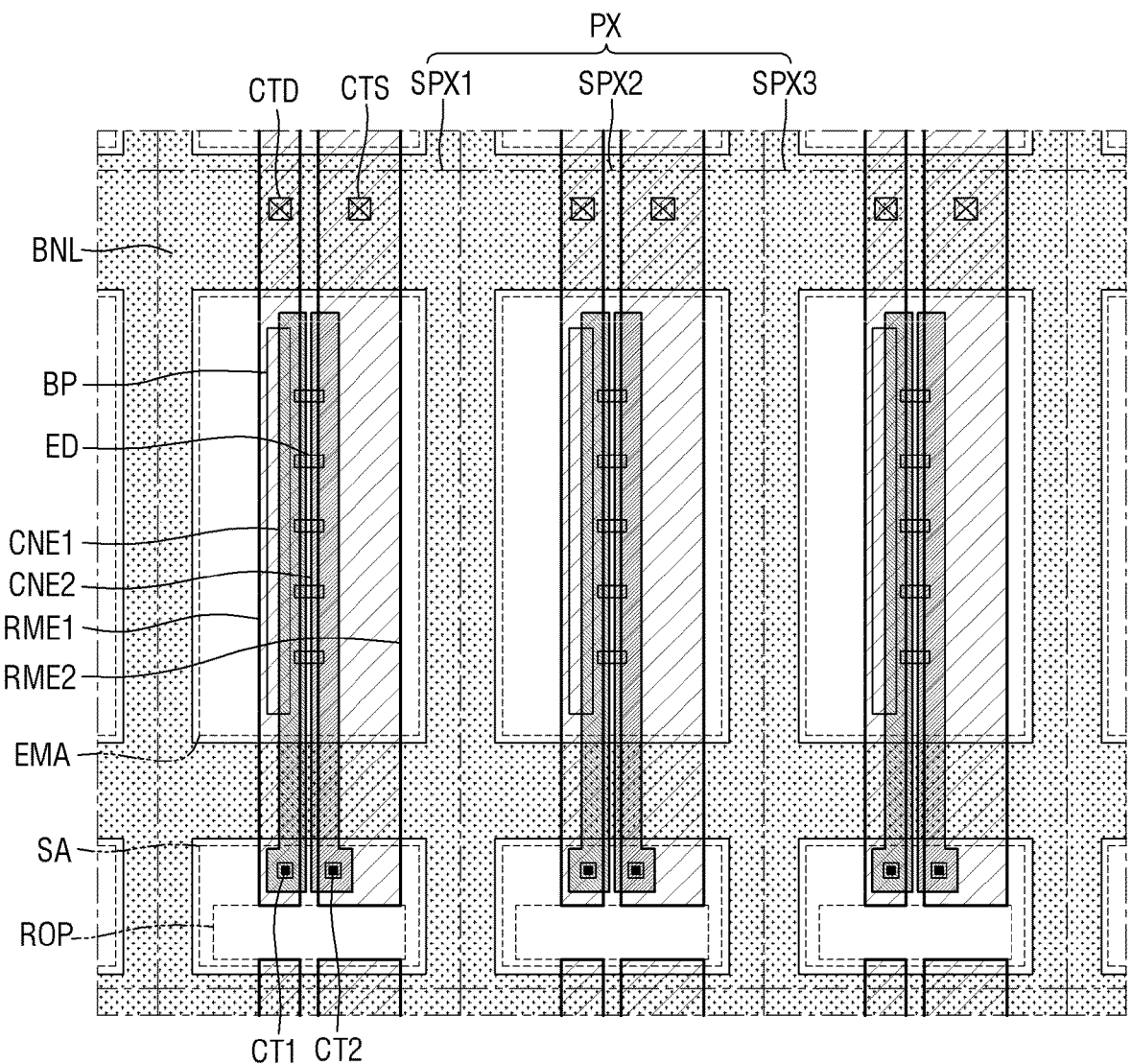
FIG. 3 is a plan view of a pixel of the display device according to some embodiments.

FIG. 3 is a plan view of a pixel PX of the display device 10 according to some embodiments.

Referring to FIG. 3, each of the pixels PX of the display device 10 may include a plurality of subpixels SPXn (where n is 1 to 3). For example, one pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the present disclosure is not limited thereto, and the subpixels SPXn may emit light of the same color in other embodiments. In some embodiments, the subpixels SPXn may emit blue light. In addition, although one pixel PX includes three subpixels SPXn in FIG. 3, the present disclosure is not limited thereto, and the pixel PX may include a greater number of subpixels SPXn in other embodiments.

Each subpixel SPXn of the display device 10 may include an emission area EMA and a non-emission area. The emission area EMA may be an area in which light emitting elements ED are located to emit light of a corresponding wavelength band. The non-emission area may be an area in which the light emitting elements ED are not located, and from which no light is output because light emitted from the light emitting elements ED does not reach this area. The emission area EMA may include an area in which the light emitting elements ED are located, and an area that is adjacent to the light emitting elements ED and from which light emitted from the light emitting elements ED is output.

However, the present disclosure is not limited thereto, and the emission area EMA may also include an area from which light emitted from the light emitting elements ED is output after being reflected or refracted by other members or elements. A plurality of light emitting elements ED may be located in each subpixel SPXn, and an area where the light emitting elements ED are located and an area adjacent to this area may form the emission area EMA.

Although the respective emission areas EMA of the subpixels SPXn have substantially the same area in the drawing, the present disclosure is not limited thereto. In some embodiments, the respective emission areas EMA of the subpixels SPXn may have different areas according to the color or wavelength band of light emitted from the light emitting elements ED located in the subpixel SPXn.

In addition, each subpixel SPXn may further include a sub area SA located in the non-emission area. The sub area SA may be located in the second direction DR2 in relation to the corresponding emission area EMA, and may be located between the emission areas EMA of adjacent subpixels SPXn neighboring each other with respect to the second direction DR2. For example, a plurality of emission areas EMA and a plurality of sub areas SA may be repeatedly arranged in the second direction DR2 while being alternately arranged. However, the present disclosure is not limited thereto, and the arrangement of the emission areas EMA and the sub areas SA in a plurality of pixels PX may be different from that in FIG. 3 in other embodiments. In one pixel PX illustrated in FIG. 3, the emission area EMA and the sub area SA located below the emission area EMA in the second direction DR2 are included in one subpixel SPXn, and a part that is located in a direction that is opposite to the second direction DR2 of the emission area EMA may be the sub area SA of another subpixel SPXn.

A bank layer BNL may be located between the sub areas SA and the emission areas EMA, and a distance between respective ones thereof may vary according to a width of the bank layer BNL. Light might not exit from the sub area SA because the light emitting elements ED are not located in the sub area SA, although portions of one or more electrodes RME located in each subpixel SPXn may be located in the sub area SA. Some of the electrodes RME located in different subpixels SPXn may be separated from each other with respect to a separation part ROP of the sub area SA.

The bank layer BNL may include parts extending in the first direction DR1 and in the second direction DR2 in plan view to form a grid pattern in the entire display area DPA. The bank layer BNL may be located at the boundary of each subpixel SPXn to separate neighboring subpixels SPXn. In addition, the bank layer BNL may surround the emission area EMA located in each subpixel SPXn to separate the emission areas EMA from each other.

Each pixel PX or subpixel SPXn of the display device 10 may include a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit can be variously changed. According to some embodiments, each subpixel SPXn of the display device 10 may have a 3T1C structure in which the pixel driving circuit includes three transistors and one capacitor. However, the present disclosure is not limited thereto, and other various modified pixel structures such as a 2T1C structure, a 7T1C structure, and a 6T1C structure are also applicable in other embodiments.

The structure of a subpixel SPXn of the display device 10 according to some embodiments will now be described in detail with further reference to other drawings.

Figure 4:
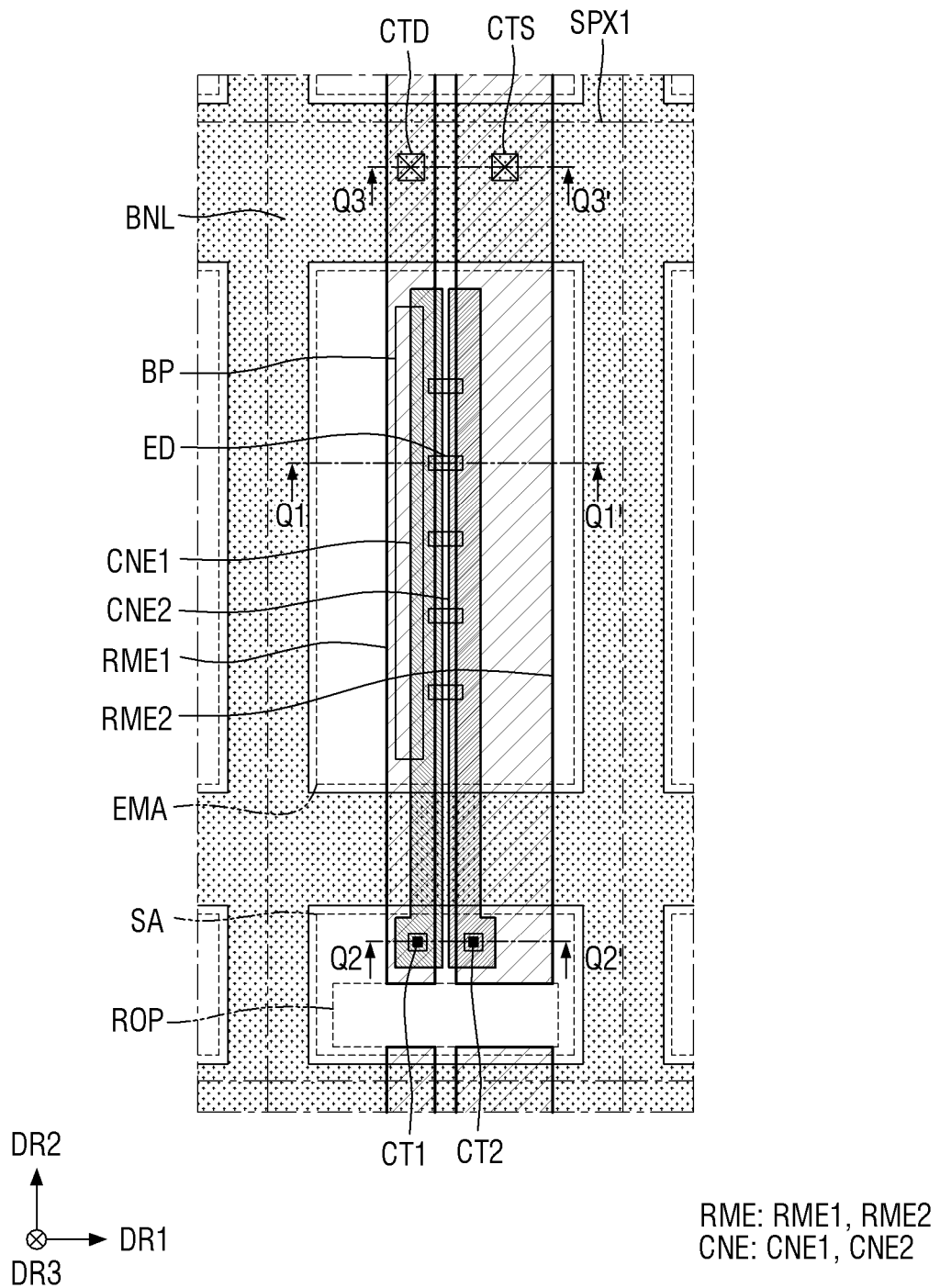
FIG. 4 is a plan view of a first subpixel of the display device according to some embodiments.
Figure 5:
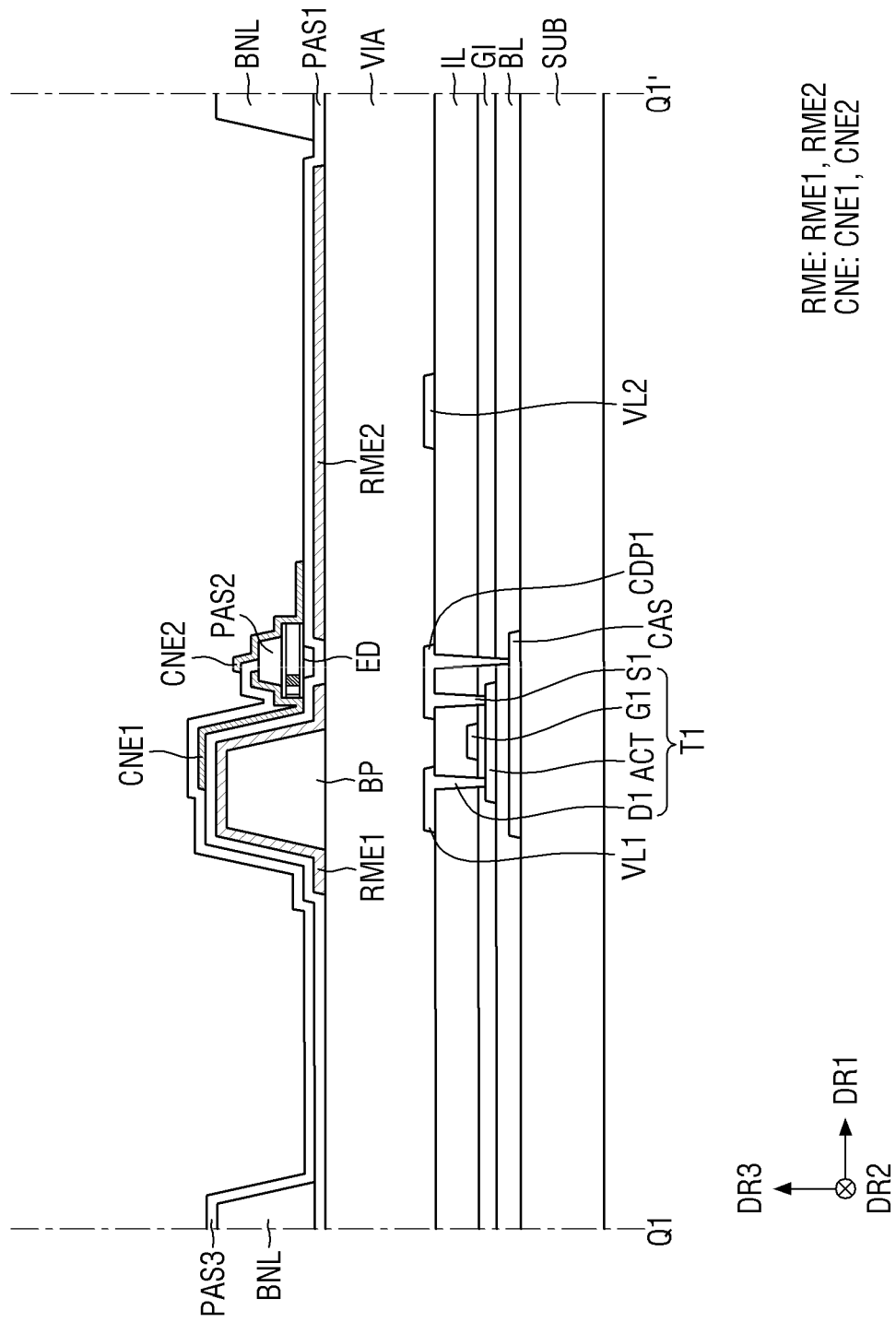
FIG. 5 is a cross-sectional view taken along the line Q1-Q1' of FIG. 4.
Figure 6:
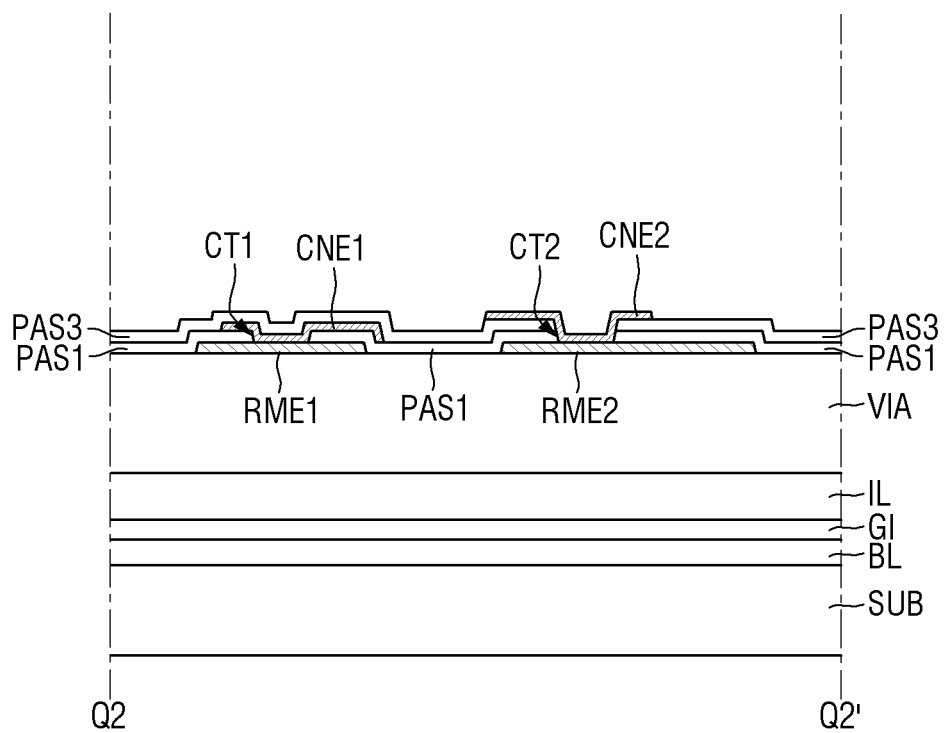
FIG. 6 is a cross-sectional view taken along the line Q2-Q2' of FIG. 4.
Figure 6:
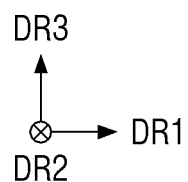
Figure 7:
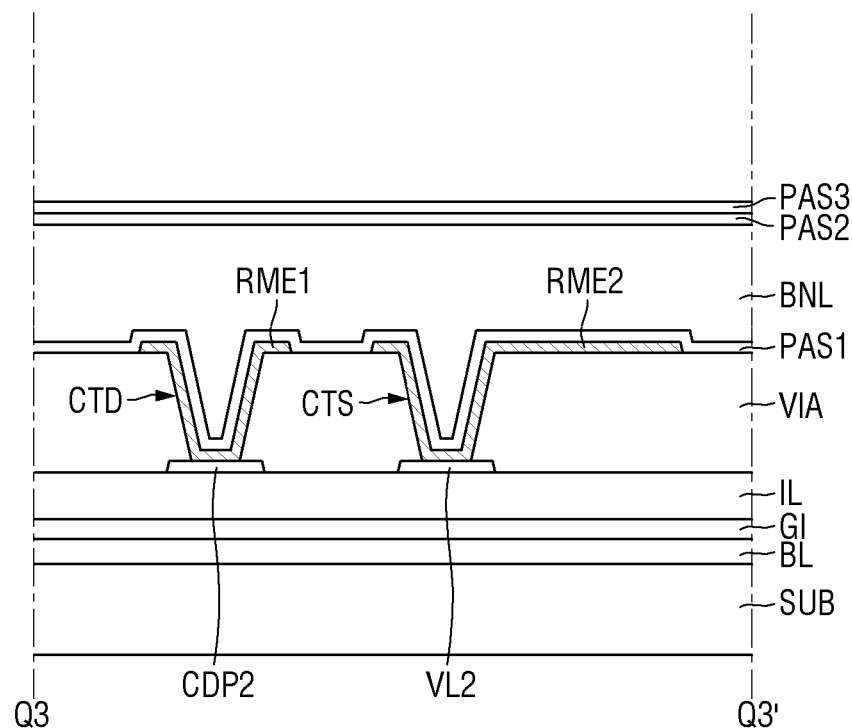
FIG. 7 is a cross-sectional view taken along the line Q3-Q3' of FIG. 4.
Figure 7:
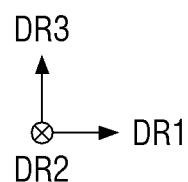
Figure 8:
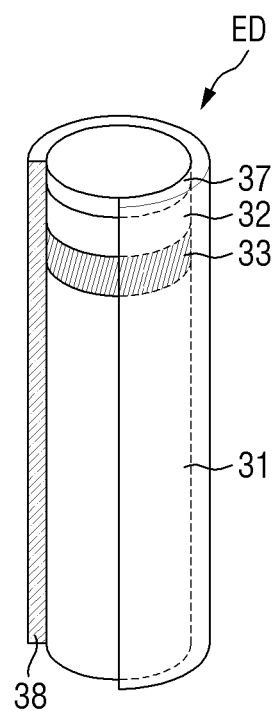
FIG. 8 is a schematic perspective view of a light emitting element according to some embodiments.
Figure 9:
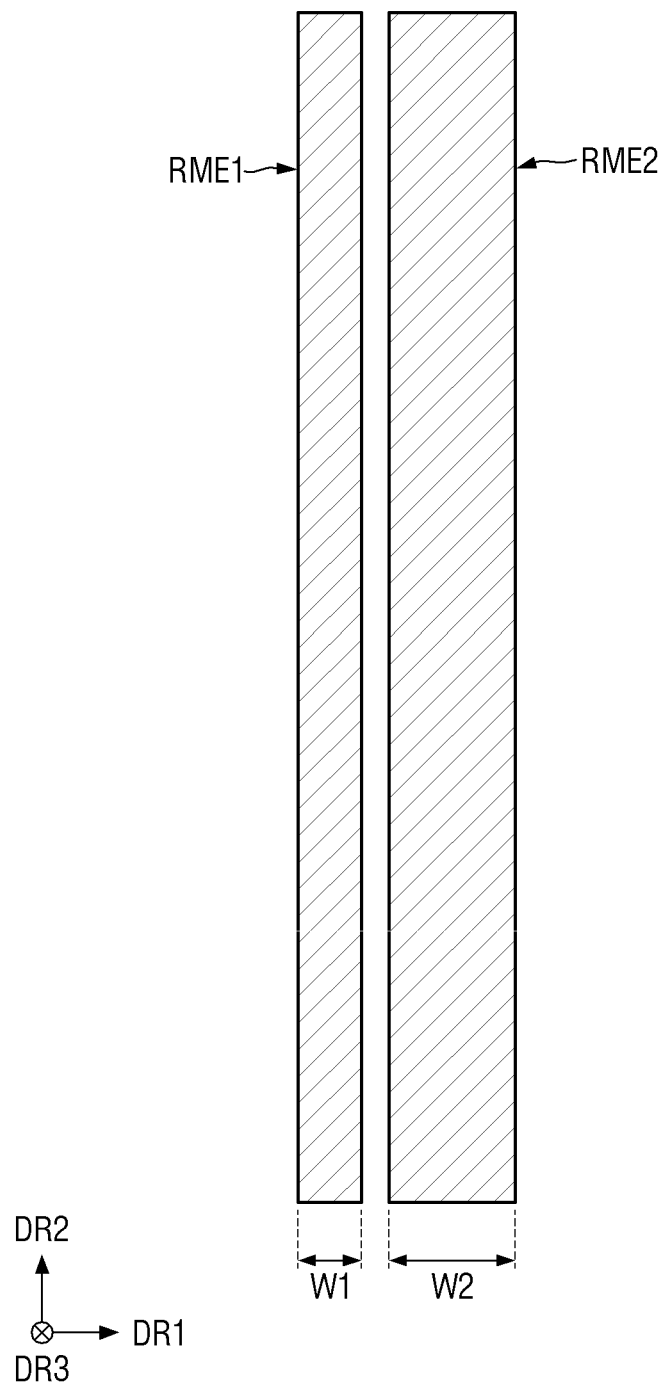
FIG. 9 is a plan view of a first electrode and a second electrode according to some embodiments.

FIG. 4 is a plan view of the first subpixel SPX1 of the display device 10 according to some embodiments. FIG. 5 is a cross-sectional view taken along the line Q1-Q1' of FIG. 4. FIG. 6 is a cross-sectional view taken along the line Q2-Q2' of FIG. 4. FIG. 7 is a cross-sectional view taken along the line Q3-Q3' of FIG. 4. FIG. 8 is a schematic perspective view of a light emitting element ED according to some embodiments. FIG. 9 is a plan view of a first electrode RME1 and a second electrode RME2 according to some embodiments.

Referring to FIGS. 4 through 9, the display device 10 may include a substrate SUB and may include a semiconductor layer, a plurality of conductive layers, and a plurality of insulating layers located on the substrate SUB. The semiconductor layer, the conductive layers, and the insulating layers may constitute a circuit layer and a display element layer of the display device 10.

For example, the substrate SUB may be an insulating substrate. The substrate SUB may be made of an insulating material such as glass, quartz, or polymer resin. In addition, the substrate SUB may be a rigid substrate, but may also be a flexible substrate that can be bent, folded, rolled, etc. The substrate SUB may include the display area DPA, the non-display area NDA surrounding the display area DPA, and a pad area PDA corresponding to a portion of the non-display area NDA.

A first conductive layer may be located on the substrate SUB. The first conductive layer includes a bottom metal layer CAS, and the bottom metal layer CAS is overlapped by an active layer ACT of a first transistor T1. The bottom metal layer CAS may include a light blocking material to reduce or prevent light from entering the active layer ACT of the first transistor T1. However, the bottom metal layer CAS may be omitted in other embodiments.

A buffer layer BL may be located on the bottom metal layer CAS and the substrate SUB. The buffer layer BL may be formed on the substrate SUB to protect transistors of the pixels PX from moisture introduced through the substrate SUB, which is vulnerable to moisture penetration, and may perform a surface planarization function.

The semiconductor layer is located on the buffer layer BL. The semiconductor layer may include the active layer ACT of the first transistor T1. The active layer ACT may be partially overlapped by a gate electrode G1 of a second conductive layer, which will be described later.

The semiconductor layer may include polycrystalline silicon, monocrystalline silicon, an oxide semiconductor, or the like. In some embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and/or indium gallium zinc tin oxide (IGZTO).

Although one first transistor T1 is located in each subpixel SPXn of the display device 10 in the drawings, the present disclosure is not limited thereto. The display device 10 may include a greater number of transistors.

A gate insulating layer GI is located on the semiconductor layer and the buffer layer BL. The gate insulating layer GI may serve as a gate insulating film of the first transistor T1.

A second conductive layer is located on the gate insulating layer GI. The second conductive layer may include the gate electrode G1 of the first transistor T1. The gate electrode G1 may overlap a channel region of the active layer ACT in the third direction DR3, which is the thickness direction.

An interlayer insulating layer IL is located on the second conductive layer. The interlayer insulating layer IL may function as an insulating film between the second conductive layer and other layers located on the second conductive layer, and may protect the second conductive layer.

A third conductive layer is located on the interlayer insulating layer IL. The third conductive layer may include a first voltage line VL1 and a second voltage line VL2 located in the display area DPA, and a plurality of conductive patterns CDP1 and CDP2.

A high potential voltage (or a first power supply voltage) supplied to the first electrode RME1 may be applied to the first voltage line VL1, and a low potential voltage (or a second power supply voltage) supplied to the second electrode RME2 may be applied to the second voltage line VL2. A portion of the first voltage line VL1 may contact the active layer ACT of the first transistor T1 through a contact hole penetrating the interlayer insulating layer IL and the gate insulating layer GI. The first voltage line VL1 may serve as a first drain electrode D1 of the first transistor T1. The second voltage line VL2 may be directly connected to the second electrode RME2 to be described later.

A first conductive pattern CDP1 may contact the active layer ACT of the first transistor T1 through a contact hole penetrating the interlayer insulating layer IL and the first gate insulating layer GI. In addition, the first conductive pattern CDP1 may contact the bottom metal layer CAS through another contact hole. The first conductive pattern CDP1 may serve as a source electrode S1 of the first transistor T1.

A second conductive pattern CDP2 may be connected to the first electrode RME1 to be described later. In addition, the second conductive pattern CDP2 may be electrically connected to the first transistor T1 through the first conductive pattern CDP1. In the drawings, the first conductive pattern CDP1 and the second conductive pattern CDP2 are separated from each other. However, in some embodiments, the second conductive pattern CDP2 may be integrated with the first conductive pattern CDP1 to form one pattern. The first transistor T1 may send the first power supply voltage received from the first voltage line VL1 to the first electrode RME1.

Although the first conductive pattern CDP1 and the second conductive pattern CDP2 are formed on the same layer in the drawings, the present disclosure is not limited thereto. In some embodiments, the second conductive pattern CDP2 may be formed of a different conductive layer from the first conductive pattern CDP1. For example, the second conductive pattern CDP2 may be formed of a fourth conductive layer located on the third conductive layer with one or more insulating layers interposed between them. In this case, the first voltage line VL1 and the second voltage line VL2 may also be formed of the fourth conductive layer instead of the third conductive layer, and the first voltage line VL1 may be electrically connected to the drain electrode D1 of the first transistor T1 through another conductive pattern.

Each of the buffer layer BL, the gate insulating layer GI, and the interlayer insulating layer IL described above may be composed of a plurality of inorganic layers stacked alternately. For example, each of the buffer layer BL, the gate insulating layer GI, and the interlayer insulating layer IL may be a double layer in which inorganic layers including at least any one of silicon oxide ($SiO_x$), silicon nitride ($SiN_x$), and/or silicon oxynitride ($SiO_xN_y$) are stacked or may be a multilayer in which the inorganic layers are alternately stacked. However, the present disclosure is not limited thereto, and each of the buffer layer BL, the gate insulating layer GI, and the interlayer insulating layer IL may also be composed of one inorganic layer including any one of the above insulating materials. In addition, in some embodiments, the interlayer insulating layer IL may be made of an organic insulating material such as polyimide (PI).

Each of the second conductive layer and the third conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and/or alloys of the same.

A via layer VIA is located on the third conductive layer in the display area DPA. The via layer VIA may include an organic insulating material, such as polyimide (PI), and may perform a surface planarization function.

A bank pattern BP, a plurality of electrodes RME (RME1 and RME2), the bank layer BNL, a plurality of light emitting elements ED, and a plurality of connection electrodes CNE (CNE1 and CNE2) are located as the display element layer on the via layer VIA. In addition, a plurality of insulating layers PAS1, PAS2, and PAS3 may be located on the via layer VIA.

The bank pattern BP may be directly located on the via layer VIA in the display area DPA. The bank pattern BP may extend in the second direction DR2 and may be located in the emission area EMA of each subpixel SPXn. The bank pattern BP may be located on a left side of the center of the emission area EMA, which may be a direction that is opposite to the first direction DR1. The light emitting elements ED may be located on a side of the bank pattern BP.

A length of the bank pattern BP extending in the second direction DR2 may be smaller than a length, in the second direction DR2, of the emission area EMA surrounded by the bank layer BNL. The bank pattern BP may be located in the emission area EMA of each subpixel SPXn in the entire display area DPA to form an island pattern having a narrow width and extending in one direction.

At least a portion of the bank pattern BP may protrude from an upper surface of the via layer VIA. The protruding portion of the bank pattern BP may have inclined side surfaces, and light emitted from the light emitting elements ED may be reflected upward above the via layer VIA by the first electrode RME1 located on the bank pattern BP. However, the present disclosure is not limited thereto, and the bank pattern BP may also have a semicircular or semielliptical shape having a curved outer surface. The bank pattern BP may include, but is not limited to, an organic insulating material, such as polyimide (PI).

The electrodes RME extend in one direction and are located in each subpixel SPXn. The electrodes RME may extend in the second direction DR2, may be located in the emission area EMA of each subpixel SPXn, and may be spaced apart from each other in the first direction DR1. The electrodes RME may be electrically connected to the light emitting elements ED. Each of the electrodes RME may be electrically connected to the light emitting elements ED through a respective connection electrode CNE (CNE1 or CNE2) to be described later, and may send an electrical signal received from a conductive layer located thereunder to the light emitting elements ED.

The display device 10 includes the first electrode RME1 and the second electrode RME2 located in each subpixel SPXn. The first electrode RME1 is located on the left side of the center of the emission area EMA, and the second electrode RME2 is spaced apart from the first electrode RME1 in the first direction DR1 and located on a right side of the center of the emission area EMA. The first electrode RME1 is located on the bank pattern BP. The second electrode RME2 is located on the via layer VIA to directly contact the upper surface of the via layer VIA. The first electrode RME1 and the second electrode RME2 may extend beyond the bank layer BNL to lie in a portion of a corresponding subpixel SPXn and sub area SA. The first electrodes RME1 and the second electrodes RME2 of different subpixels SPXn may be spaced apart from each other by the separation part ROP located in the sub area SA of any one subpixel SPXn.

A portion of the first electrode RME1 may be located on the inclined side surfaces of the bank pattern BP. The first electrode RME1 may cover at least one side surface of the bank pattern BP to reflect light emitted from the light emitting elements ED. At least a portion of each of the first electrode RME1 and the second electrode RME2 may be directly located on the via layer VIA so that they lie in the same plane. For example, a lower surface of the second electrode RME2 may contact the via layer VIA in the emission area EMA. Each of the first electrode RME1 and the second electrode RME2 may have a width measured in the first direction DR1, and the width of the second electrode RME2 may be greater than the width of the first electrode RME1, as will be described later.

Each electrode RME may extend from the emission area EMA to the sub area SA, and may include a part overlapping the bank layer BNL and a part located in the sub area SA. According to some embodiments, a portion of each electrode RME may be located in the sub area SA, and the connection electrodes CNE may extend from the emission area EMA to the sub area SA beyond the bank layer BNL. That is, a portion of each electrode RME may be located outside the bank layer BNL based on the emission area EMA.

The first electrode RME1 and the second electrode RME2 may be connected to the third conductive layer respectively through a first electrode contact hole CTD and a second electrode contact hole CTS formed in a part overlapping the bank layer BNL. The first electrode RME1 may contact the second conductive pattern CDP2 through the first electrode contact hole CTD penetrating the via layer VIA under the first electrode RME1. The second electrode RME2 may contact the second voltage line VL2 through the second electrode contact hole CTS penetrating the via layer VIA under the second electrode RME2. The first electrode RME1 may be electrically connected to the first transistor T1 through the second conductive pattern CDP2 and the first conductive pattern CDP1 to receive the first power supply voltage, and the second electrode RME2 may be electrically connected to the second voltage line VL2 to receive the second power supply voltage.

In addition, the width of the second electrode RME2 measured in the first direction DR1 may be greater than the width of the first electrode RME1 measured in the first direction DR1. Here, the width may mean a width measured in the first direction DR1 in a plane seen from above.

In some embodiments, the electrodes RME may be made of a ferroelectric. The ferroelectric is a material having spontaneous polarization because an electric dipole moment therein is aligned even in the absence of an external electric field. In the current embodiment, the first electrode RME1 and the second electrode RME2 may include a ferroelectric. The ferroelectric may include at least one of a perovskite ferroelectric such as $PbZr_{1-x}Ti_xO_3$ (PZT) and a bismuth layered ferroelectric such as $SrBi_2Ta_2O_9$ (SBT) or $Bi_{4-x}La_xTi_3O_{12}$ (BLT) (where x is 0.75). However, the present disclosure is not limited thereto, and any ferroelectric is applicable. The ferroelectric may have a Curie temperature Tc representing ferroelectric properties, and may exhibit ferroelectric properties below the Curie temperature Tc. The above ferroelectric materials may have a Curie temperature Tc of 800° C. or below to exhibit ferroelectric properties in an alignment process of the light emitting elements ED. The Curie temperature Tc of the first electrode RME1 and the second electrode RME2 may be in the range of about 100 to about 800° C., but is not limited thereto and may also be in the range of about 200 to about 600° C.

In the current embodiment, when ink including the light emitting elements ED is applied on the substrate SUB, the first electrode RME1 and the second electrode RME2 made of a ferroelectric may orient the light emitting elements ED without the application of an electric field. For example, the ferroelectric may have a remanent polarization value Pr that exists in the absence of an external electric field, and may have a coercive field Ec that is substantially similar to the strength of an electric field formed when an external electric field is applied. For example, each of PZT, SBT, and BLT may have a remanent polarization value and a coercive field as shown in Table 1 below.

TABLE 1

| | PZT | SBT | BLT |
|---|---|---|---|
| Remanent polarization value (Pr)(μc/cm$^2$) | 10~35 | 2~8 | 8~10 |
| Coercive field (Ec)(kV/cm$^2$) | 50~70 | 30~50 | ~50 |

For example, because the remanent polarization value Pr of the ferroelectric acts as strength versus area, the strength increases in proportion to an increase in the area of each of the first electrode RME1 and the second electrode RME2.

As described above, a width W2 of the second electrode RME2 measured in the first direction DR1 is greater than a width W1 of the first electrode RME1. That is, the area of the second electrode RME2 may be larger than the area of the first electrode RME1. When ink including the light emitting elements ED is sprayed onto the substrate SUB, the first electrode RME1 and the second electrode RME2 having different areas may have different remanent polarization values Pr. Because the area of the second electrode RME2 is larger than that of the first electrode RME1, the remanent polarization value Pr of the second electrode RME2 may be larger than the remanent polarization value Pr of the first electrode RME1. Due to the remanent polarization values Pr, an electric field is formed between the first electrode RME1 and the second electrode RME2 without the application of an external electric field. A dipole moment is generated in each light emitting element ED by the electric field generated between the first electrode RME1 and the second electrode RME2, and the light emitting elements ED may be rotated and aligned by a rotational torque TDEP that is generated by the dipole moments of the light emitting elements ED. For example, different rotational torques TDEP are applied to both ends of each light emitting element ED due to a difference between the remanent polarization values Pr of both electrodes RME. This facilitates the rotation of the light emitting elements ED, thus making it easy to align the light emitting elements ED between the first electrode RME1 and the second electrode RME2.

Therefore, the width W2 of the second electrode RME2 may be about 1.5 to about 3 times the width W1 of the first electrode RME1. When the width W2 of the second electrode RME2 is about 1 or more times the width W1 of the first electrode RME1, the remanent polarization value Pr of the second electrode RME2 may be increased, thus enabling the light emitting elements ED to be aligned without the application of an external electric field. When the width W2 of the second electrode RME2 is about 3 times or less the width W1 of the first electrode RME1, an increase in the area of a subpixel SPXn can be reduced or prevented. However, the present disclosure is not limited thereto, and various adjustments are possible as long as the width W2 of the second electrode RME2 is greater than the width W1 of the first electrode RME1.

A first insulating layer PAS1 may be located in the entire display area DPA, and may be located on the via layer VIA and the electrodes RME. The first insulating layer PAS1 may protect the electrodes RME while insulating them from each other. For example, because the first insulating layer PAS1 covers the electrodes RME before the bank layer BNL is formed, the first insulating layer PAS1 may reduce or prevent the likelihood of damage to the electrodes RME during the process of forming the bank layer BNL. In addition, the first insulating layer PAS1 may reduce or prevent the likelihood of the light emitting elements ED located thereon directly contacting other members, and thus may reduce or prevent the likelihood of the light emitting elements ED being damaged.

In some embodiments, the first insulating layer PAS1 may be stepped such that a portion of an upper surface of the first insulating layer PAS1 is depressed between the electrodes RME spaced apart from each other in the first direction DR1. The light emitting elements ED may be located on the stepped upper surface of the first insulating layer PAS1, and a space may be formed between each of the light emitting elements ED and the first insulating layer PAS1.

According to some embodiments, the first insulating layer PAS1 may cover the electrodes RME, but may also define a plurality of openings partially exposing upper surfaces of the electrodes RME. For example, the first insulating layer PAS1 may include contact parts CT1 and CT2 partially exposing the electrodes RME, respectively. A first contact part CT1 may be located on the first electrode RME1 in the sub area SA, and may expose a portion of an upper surface of the first electrode RME1. A second contact part CT2 may be located on the second electrode RME2 in the sub area SA, and may expose a portion of an upper surface of the second electrode RME2. That is, the first contact part CT1 and the second contact part CT2 may be located outside the bank layer BNL based on the emission area EMA.

The connection electrodes CNE to be described later may respectively contact the electrodes RME exposed through the first contact part CT1 and the second contact part CT2. In addition, the first insulating layer PAS1 may expose the upper surface of the via layer VIA in the separation part ROP in which the electrodes RME of different subpixels SPXn are spaced apart.

The bank layer BNL may be located on the first insulating layer PAS1. The bank layer BNL may include parts extending in the first direction DR1 and the second direction DR2, and may surround each subpixel SPXn. In addition, the bank layer BNL may surround the emission area EMA and the sub area SA of each subpixel SPXn to separate them, and may surround the outermost periphery of the display area DPA to separate the display area DPA and the non-display area NDA. The bank layer BNL may be entirely located in the display area DPA to form a grid pattern, and areas exposed by the bank layer BNL in the display area DPA may be the emission area EMA and the sub area SA.

Like the bank pattern BP, the bank layer BNL may have a height (e.g., a predetermined height). In some embodiments, an upper surface of the bank layer BNL may be at a greater height than the bank pattern BP, and a thickness of the bank layer BNL may be about equal to or greater than that of the bank pattern BP. The bank layer BNL may reduce or prevent the likelihood of ink overflowing to adjacent subpixels SPXn in an inkjet printing process during a manufacturing process of the display device 10. Like the bank pattern BP, the bank layer BNL may include an organic insulating material, such as polyimide.

The light emitting elements ED may be located on the first insulating layer PAS1. The light emitting elements ED may extend in a direction, and the direction in which the light emitting elements ED extend may be parallel to the substrate SUB. As will be described later, each light emitting element ED may include a plurality of semiconductor layers located along an extension/extending direction thereof, and the semiconductor layers may be sequentially located along a direction that is substantially parallel to the upper surface of the substrate SUB. However, the present disclosure is not limited thereto. When the light emitting elements ED have a different structure, the semiconductor layers may be arranged in a direction that is substantially perpendicular to the substrate SUB.

The light emitting elements ED may be located on the electrodes RME that are spaced apart in the first direction DR1. A length of each light emitting element ED may be greater than a distance between the electrodes RME spaced apart in the first direction DR1. The light emitting elements ED may be located such that at least one end thereof lies on any one of the different electrodes RME, or such that both ends lie on the different electrodes RME, respectively. The light emitting elements ED may be located such that both ends thereof respectively lie on the different electrodes RME. The direction in which each electrode RME extends, and the direction in which the light emitting elements ED extend, may be substantially perpendicular to each other. The light emitting elements ED may be spaced apart from each other along the second direction DR2 in which each electrode RME extends, and may be aligned to be substantially parallel to each other. However, the present disclosure is not limited thereto, and one or more of the light emitting elements ED may also extend obliquely to the direction in which each electrode RME extends.

The light emitting elements ED located in each subpixel SPXn may emit light of different wavelength bands depending on the materials that form the semiconductor layers described above. However, the present disclosure is not limited thereto, and the light emitting elements ED located in each subpixel SPXn may also emit light of substantially the same color by including the semiconductor layers made of the same material. The light emitting elements ED may be electrically connected to the electrodes RME and the conductive layers under the via layer VIA by contacting the connection electrodes CNE (CNE1 and CNE2), and may emit light of a corresponding wavelength band in response to an electrical signal.

A second insulating layer PAS2 may be located on or above the light emitting elements ED, the first insulating layer PAS1, and the bank layer BNL. The second insulating layer PAS2 includes a pattern part extending in the second direction DR2 between the electrodes RME, and located on the light emitting elements ED. The pattern part may partially cover outer surfaces of the light emitting elements ED, and might not cover both sides or both ends of the light emitting elements ED. The pattern part may form a linear or island pattern in each subpixel SPXn in plan view. The pattern portion of the second insulating layer PAS2 may protect the light emitting elements ED while fixing the light emitting elements ED during the process of manufacturing the display device 10. In addition, the second insulating layer PAS2 may fill a space between the light emitting elements ED and the first insulating layer PAS1 under the light emitting elements ED. In addition, a portion of the second insulating layer PAS2 may be located on the bank layer BNL and in the sub areas SA. A portion of the second insulating layer PAS2 that is located in the sub area SA might not be located in the first contact part CT1, the second contact part CT2, or the separation part ROP.

A plurality of connection electrodes CNE (CNE1 and CNE2) may be respectively located on, and may contact, the electrodes RME and the light emitting elements ED. Each of the connection electrodes CNE may contact any one end of each light emitting element ED, and may contact at least any one of the electrodes RME through the contact part CT1 or CT2 penetrating the first insulating layer PAS1 and the second insulating layer PAS2.

A first connection electrode CNE1 may extend in the second direction DR2, and may be located on the first electrode RME1. A portion of the first connection electrode CNE1 that is located on the bank pattern BP may overlap the first electrode RME1, and may extend in the second direction DR2 from the portion of the first connection electrode CNE1 located on the bank pattern BP. The first connection electrode CNE1 may extend from the emission area EMA to the sub area SA beyond the bank layer BNL. The first connection electrode CNE1 may contact the first electrode RME1 through the first contact part CT1 exposing the first electrode RME1 in the sub area SA. The first connection electrode CNE1 may contact the light emitting elements ED and the first electrode RME1 to send an electrical signal received from the first transistor T1 to the light emitting elements ED.

A second connection electrode CNE2 may extend in the second direction DR2, and may be located on the second electrode RME2. The second connection electrode CNE2 may extend from the emission area EMA to the sub area SA beyond the bank layer BNL. The second connection electrode CNE2 may contact the second electrode RME2 through the second contact part CT2 exposing the second electrode RME2 in the sub area SA. The second connection electrode CNE2 may contact the light emitting elements ED and the second electrode RME2 to send an electrical signal received from the second voltage line VL2 to the light emitting elements ED.

A third insulating layer PAS3 is located on the first connection electrode CNE1 and the second insulating layer PAS2. The third insulating layer PAS3 may be located on the second insulating layer PAS2 to cover the first connection electrode CNE1, and a portion of the second connection electrode CNE2 may be located on the third insulating layer PAS3. The third insulating layer PAS3 may insulate the first connection electrode CNE1 and the second connection electrode CNE2 from each other so that the first connection electrode CNE1 does not directly contact the second connection electrode CNE2.

The third insulating layer PAS3 may be entirely located in the sub area SA with the exception of a part in which the second contact part CT2 is located in the sub area SA, and may cover the first contact part CT1 and the separation part ROP. Because the second connection electrode CNE2 is located in the second contact part CT2, the third insulating layer PAS3 may expose the second contact part CT2. Because the first connection electrode CNE1 is located in the first contact part CT1, the third insulating layer PAS3 may cover the first contact part CT1 together with the first connection electrode CNE1. In addition, the third insulating layer PAS3 may cover the separation part ROP to directly contact the upper surface of the via layer VIA exposed between the electrodes RME spaced apart from each other.

In some embodiments, another insulating layer may be further located on the third insulating layer PAS3 and the second connection electrode CNE2. The insulating layer may function to protect members located on the substrate SUB from the external environment.

The first insulating layer PAS1, the second insulating layer PAS2, and the third insulating layer PAS3 described above may include an inorganic insulating material or an organic insulating material.

Referring to FIG. 8, a light emitting element ED may be a light emitting diode. For example, the light emitting element ED may be an inorganic light emitting diode having a size of nanometers to micrometers, and may be made of an inorganic material. When an electric field is formed in a given direction between two electrodes facing each other, the light emitting element ED may be aligned between the two electrodes in which polarities are formed.

The light emitting element ED according to some embodiments may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped, and a hexagonal prism, and may have a shape extending in a direction and having a partially inclined outer surface.

The light emitting element ED may include a semiconductor layer doped with impurities of any conductivity type (e.g., a p type or an n type). The semiconductor layer may receive an electrical signal from an external power source, and may emit light of a corresponding wavelength band. The light emitting element ED may include a first semiconductor layer 31, a second semiconductor layer 32, a light emitting layer 33, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN, and/or InN. An n-type dopant used to dope the first semiconductor layer 31 may be Si, Ge, Sn, and/or the like.

The second semiconductor layer 32 is located on the first semiconductor layer 31 with the light emitting layer 33 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN, and/or InN. A p-type dopant used to dope the second semiconductor layer 32 may be Mg, Zn, Ca, Se, Ba, and/or the like.

Although each of the first semiconductor layer 31 and the second semiconductor layer 32 is composed of one layer in the drawing, the present disclosure is not limited thereto. Each of the first semiconductor layer 31 and the second semiconductor layer 32 may also include a greater number of layers, for example, may further include a clad layer or a tensile strain barrier reducing (TSBR) layer depending on the material of the light emitting layer 33.

The light emitting layer 33 is located between the first semiconductor layer 31 and the second semiconductor layer 32. The light emitting layer 33 may include a material having a single or multiple quantum well structure. When the light emitting layer 33 includes a material having a multiple quantum well structure, the light emitting layer 33 may have a structure in which a plurality of quantum layers and a plurality of well layers are alternately stacked. The light emitting layer 33 may emit light through combination of electron-hole pairs according to an electrical signal received through the first semiconductor layer 31 and the second semiconductor layer 32. The light emitting layer 33 may include a material such as AlGaN or AlGaInN. For example, when the light emitting layer 33 has a multiple quantum well structure in which a quantum layer and a well layer are alternately stacked, the quantum layer may include a material such as AlGaN or AlGaInN, and the well layer may include a material such as GaN or AlInN.

The light emitting layer 33 may also have a structure in which a semiconductor material having a large band gap energy and a semiconductor material having a small band gap energy are alternately stacked, or may include different group 3, group 4, or group 5 semiconductor materials depending on the wavelength band of light that it emits. Light emitted from the light emitting layer 33 is not limited to light in a blue wavelength band. In some cases, the light emitting layer 33 may emit light in a red or green wavelength band.

The electrode layer 37 may be an ohmic connection electrode. However, the present disclosure is not limited thereto, and the electrode layer 37 may also be a Schottky connection electrode. The light emitting element ED may include at least one electrode layer 37. The light emitting element ED may include one or more electrode layers 37. However, the present disclosure is not limited thereto, and the electrode layer 37 may also be omitted.

When the light emitting element ED is electrically connected to an electrode or to a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and/or indium tin zinc oxide (ITZO).

The insulating film 38 surrounds outer surfaces of the semiconductor layers and the electrode layer described above. For example, the insulating film 38 may surround an outer surface of at least the light emitting layer 33, but may expose both ends of the light emitting element ED in a longitudinal direction. In addition, an upper surface of the insulating film 38 may be rounded in cross section in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), and/or aluminum oxide ($AlO_x$). Although the insulating film 38 is illustrated as a single layer in the drawing, the present disclosure is not limited thereto. In some embodiments, the insulating film 38 may be formed in a multilayer structure in which a plurality of layers are stacked.

The insulating film 38 may protect the above members. The insulating film 38 may reduce or prevent the likelihood of an electrical short circuit that may occur in the light emitting layer 33 when the light emitting layer 33 directly contacts an electrode through which an electrical signal is transmitted to the light emitting element ED. In addition, the insulating film 38 may decrease or prevent a reduction in luminous efficiency of the light emitting element ED.

In addition, an outer surface of the insulating film 38 may be treated. The light emitting element ED may be sprayed onto electrodes in a state where it is dispersed in an ink (e.g., a predetermined ink) and then may be aligned. Here, the surface of the insulating film 38 may be hydrophobic or hydrophilic-treated so that the light emitting element ED remains separate from other adjacent light emitting elements ED in the ink without being agglomerated with them.

Referring to FIGS. 4, 5, and 8, the bank pattern BP may be overlapped by the first electrode RME1 while not being overlapped by the second electrode RME2. For example, one bank pattern BP may be located on the left side of the center of the emission area EMA in one subpixel SPXn. In the light emitting element ED having both ends located on the first electrode RME1 and the second electrode RME2, the second semiconductor layer 32, the light emitting layer 33, and the electrode layer 37 are located adjacent to one end of the light emitting element ED. As described above, the second semiconductor layer 32 is made of a p-type semiconductor, and the first semiconductor layer 31 is made of an n-type semiconductor. Therefore, the light emitting element ED operates on the principle that when a forward voltage is applied to the light emitting element ED, the light emitting layer 33 emits light. To this end, the light emitting element ED must be located such that a driving signal transmitted through the first transistor T1 is delivered to the end, to which the second semiconductor layer 32 of the light emitting element ED is adjacent, through the first electrode RME1 and the first connection electrode CNE1.

In some embodiments, the second semiconductor layer 32 and the light emitting layer 33 of the light emitting element ED may be located adjacent to the first electrode RME1, the bank pattern BP, and the first connection electrode CNE1. Light emitted from the light emitting layer 33 of the light emitting element ED may travel in a direction that is opposite to the first direction DR1, for example, in a direction in which the bank pattern BP, the first electrode RME1, and the first connection electrode CNE1 are located with respect to the light emitting layer 33. However, the light emitted from the light emitting layer 33 of the light emitting element ED does not substantially travel in the first direction DR1, for example, in a direction in which the second electrode RME2 is located with respect to the light emitting layer 33. Therefore, in the present disclosure, the bank pattern BP is located under the first electrode RME1 to which the light emitting layer 33 of the light emitting element ED is adjacent. Accordingly, the light emitted from the light emitting layer 33 may be reflected upward by the first electrode RME1, thereby improving the efficiency of the light. In addition, electrodes climbing over the bank pattern BP may be broken due to a step difference, or it may be difficult to secure a process margin. Therefore, in the current embodiment, a likelihood of the second electrode RME2 breaking may be reduced or prevented, or the process margin may be secured by placing one bank pattern BP contributing to reflection of light while omitting a bank pattern under the second electrode RME2 that would be irrelevant to reflection of light.

A process of manufacturing the display device 10 according to some embodiments will now be described.

Figure 11:
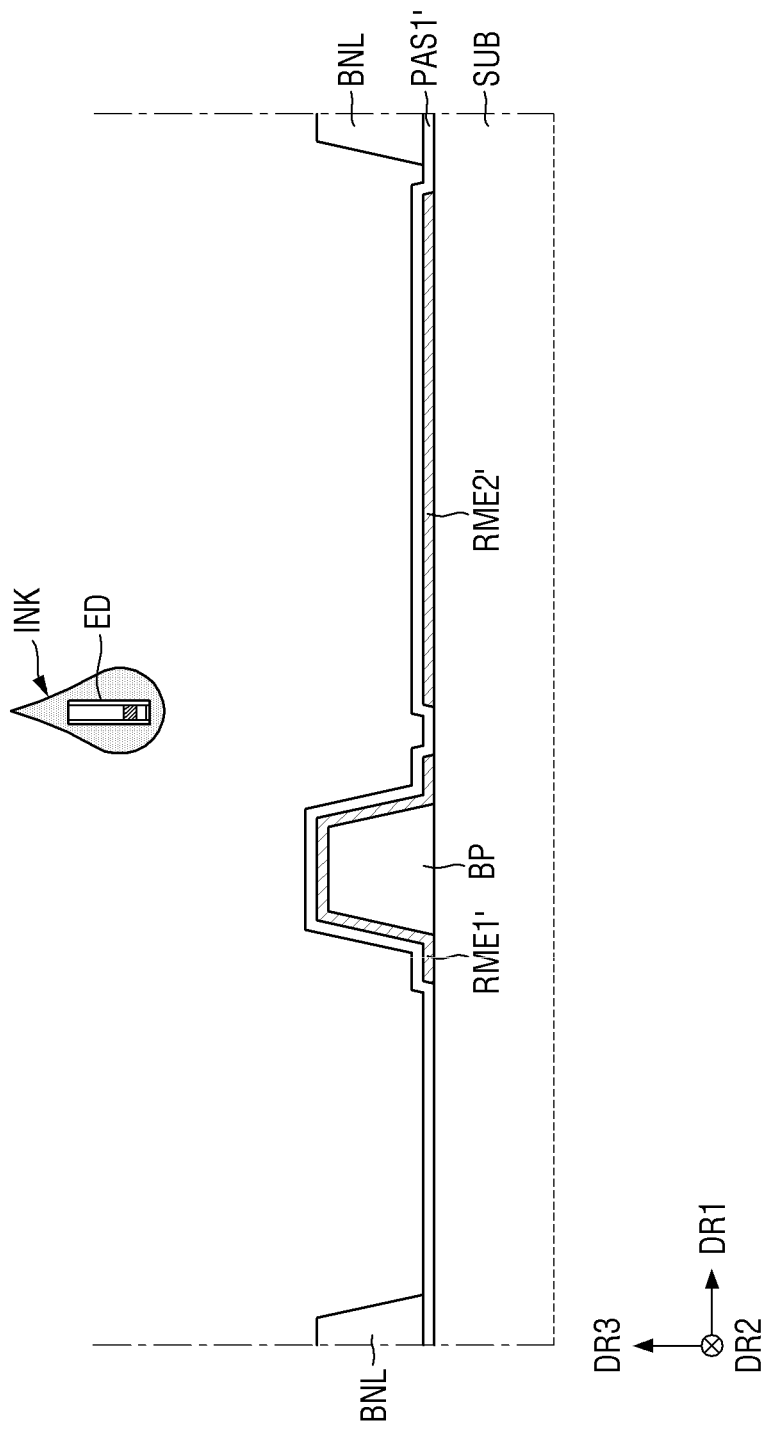
Figure 12:
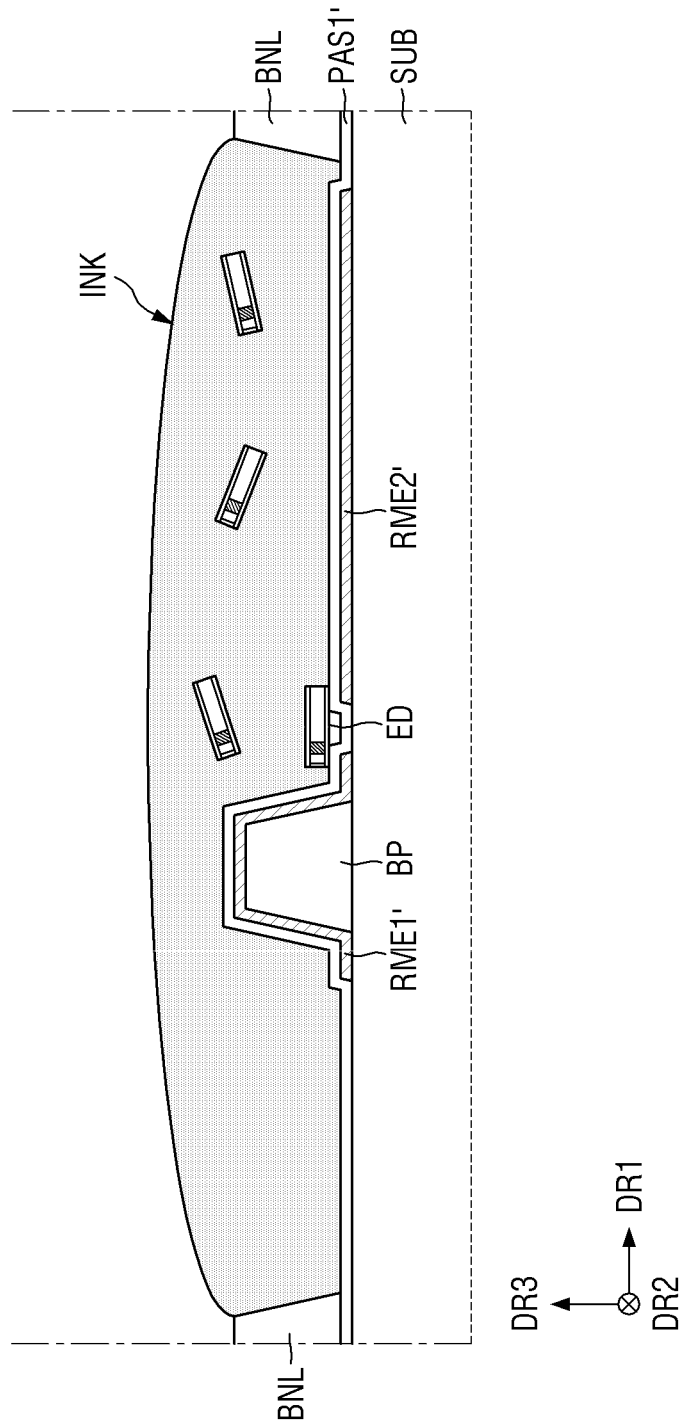
Figure 13:
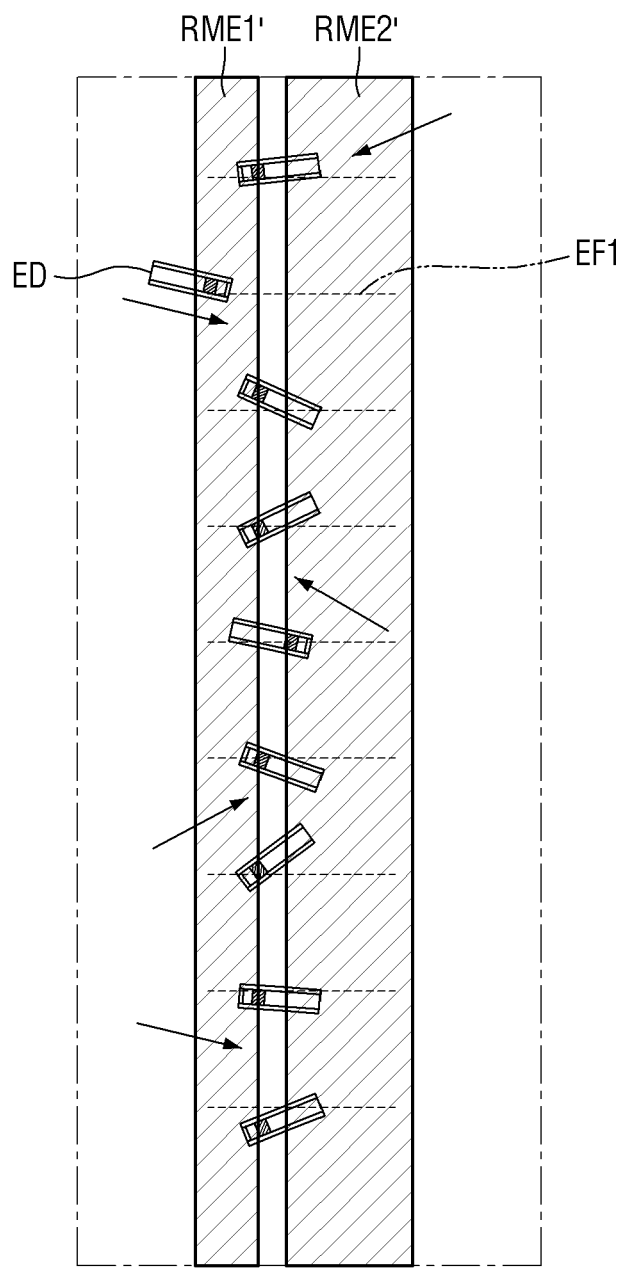
Figure 14:
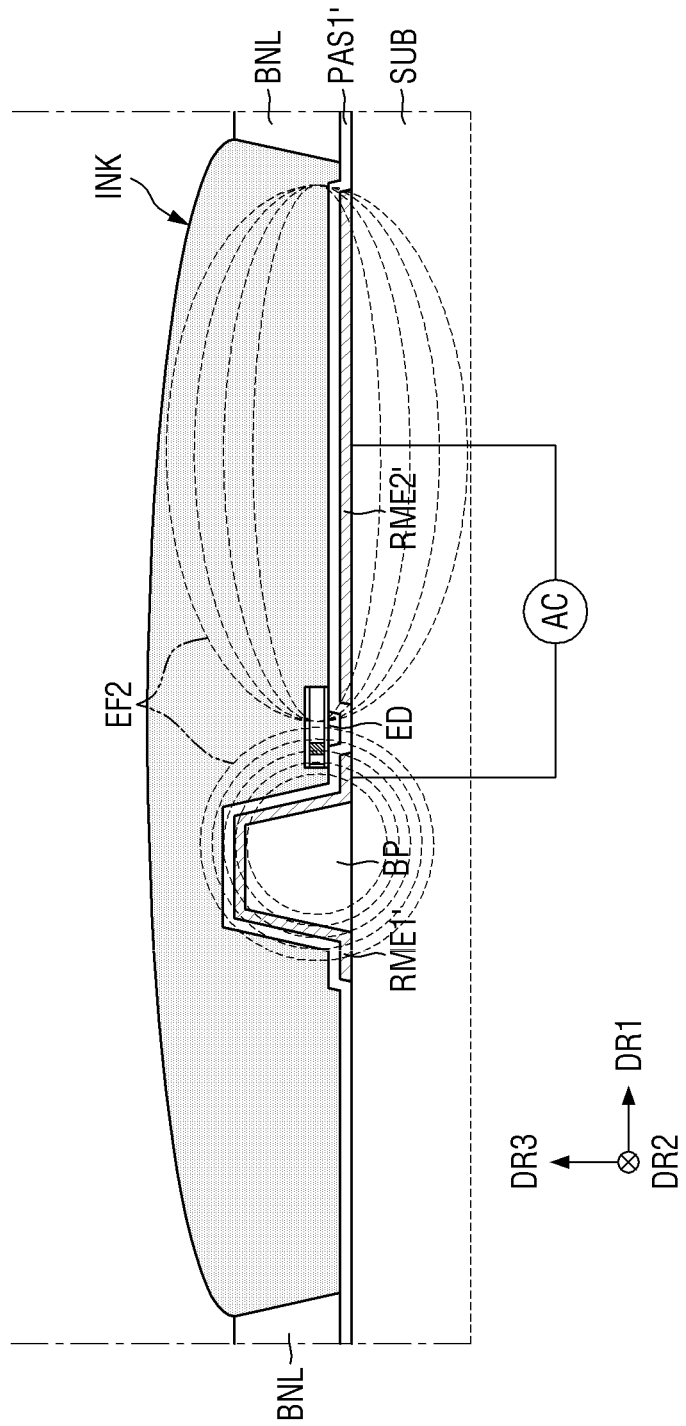
Figure 15:
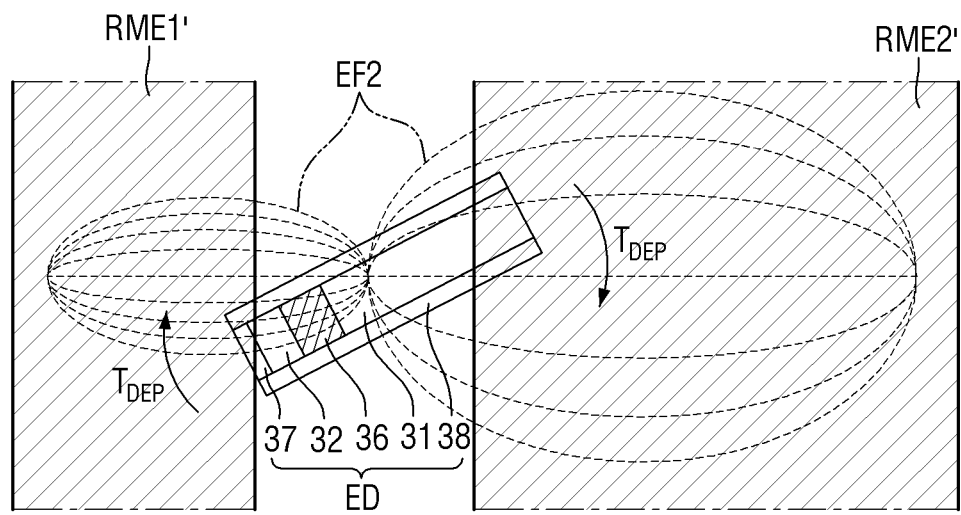
Figure 16:
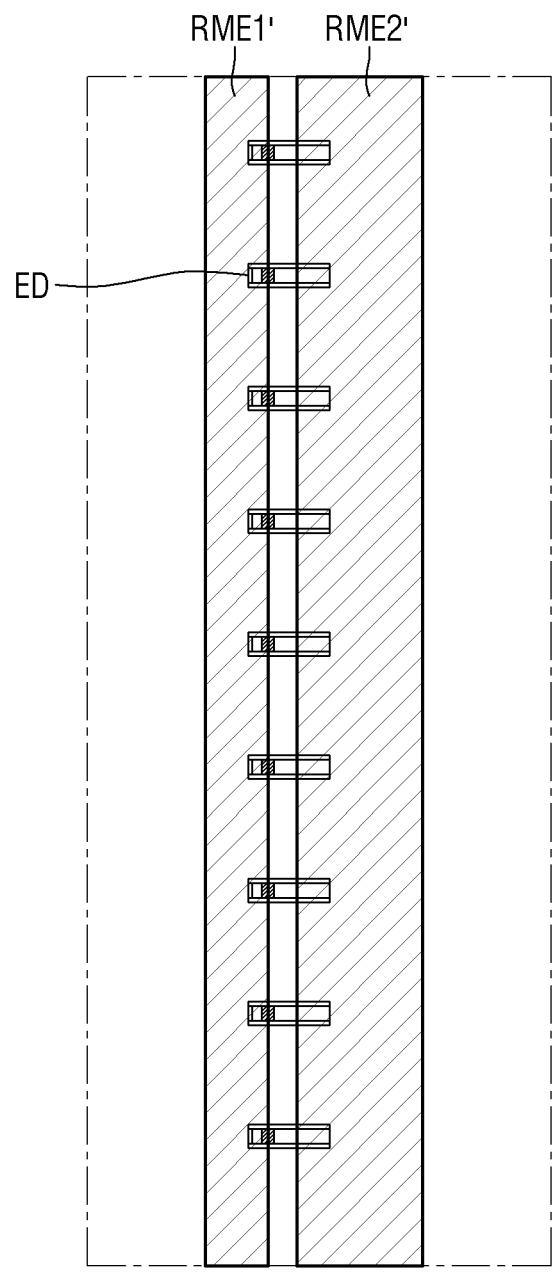

FIGS. 10 through 17 are views illustrating each process in a method of manufacturing a display device according to some embodiments. FIGS. 10 through 12, 14, and 17 illustrate a cross-sectional view of a subpixel SPXn in each process, and FIGS. 13, 15, and 16 illustrate a schematic plan view of the subpixel SPXn during a process.

Figure 10:
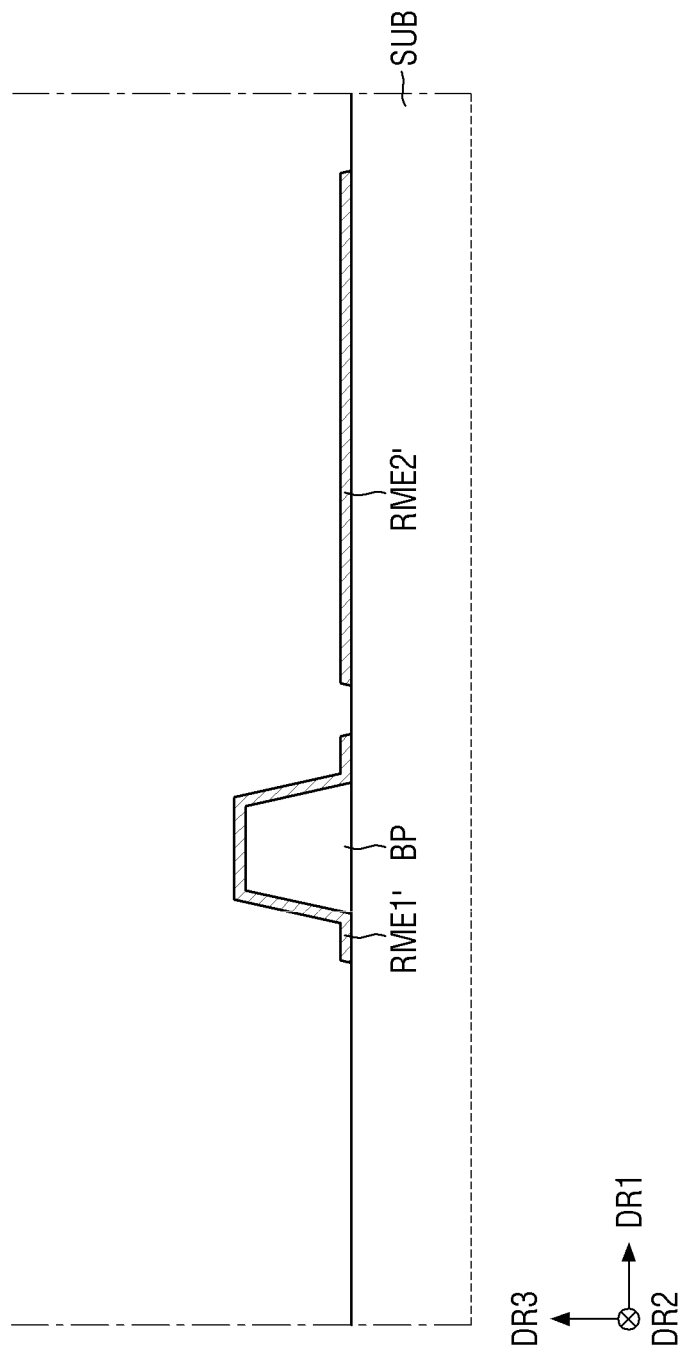
FIGS. 10 through 17 are views illustrating each process in a method of manufacturing a display device according to some embodiments.

Referring to FIG. 10, a substrate SUB is prepared. In some embodiments, the substrate SUB may include circuit elements composed of a plurality of conductive layers and a plurality of insulating layers. For ease of description, the substrate SUB including the layers will be illustrated and described below.

Next, a bank pattern BP is formed on the substrate SUB. The bank pattern BP may protrude from an upper surface of the substrate SUB, as described above.

Next, a first electrode layer RME1' and a second electrode layer RME2' are formed on the bank pattern BP and/or the substrate SUB. The first electrode layer RME1' and the second electrode layer RME2' extend in the second direction DR2, and are spaced apart from each other in the first direction DR1. The first electrode layer RME1' and the second electrode layer RME2' are made of a ferroelectric as described above. A width of the second electrode layer RME2' measured in the first direction DR1 is greater than a width of the first electrode layer RME1'. The first electrode layer RME1' is formed to cover the bank pattern BP. The first electrode layer RME1' and the second electrode layer RME2' may extend in the second direction DR2 to other subpixels SPXn during the manufacturing process of the display device 10. After light emitting elements ED are placed in a subsequent process, a cutting process for separating the first electrode layer RME1' and the second electrode layer RME2' may be performed in a sub area of each subpixel SPXn so that the first electrode layer RME1' and the second electrode layer RME2' are formed into a first electrode RME1 and a second electrode RME2, respectively.

Next, referring to FIG. 11, a first insulating layer PAS1 is formed to cover the first electrode layer RME1' and the second electrode layer RME2', and a bank layer BNL is formed on the first insulating layer PAS1. The first insulating layer PAS1 may be entirely located on the substrate SUB (e.g., may be located over an entirety of the substrate SUB), and may cover the electrode layers RME1' and RME2'. The bank layer BNL may surround each subpixel SPXn to separate the subpixels SPXn while separating an emission area and the sub area, as described above.

Next, a plurality of light emitting elements ED are placed between portions of the bank layer BNL. Both ends of the light emitting elements ED may be placed on the first electrode layer RME1' and the second electrode layer RME2' on the first insulating layer PAS1, respectively. The light emitting elements ED may be sprayed onto the substrate SUB in a state where they are dispersed in ink INK. In some embodiments, the light emitting elements ED may be prepared in a state where they are dispersed in the ink INK including a solvent, and may be sprayed on the substrate SUB in a printing process using an inkjet printing device. The ink INK sprayed through the inkjet printing device may land in an area surrounded by the bank layer BNL. The bank layer BNL may reduce or prevent the likelihood of the ink INK overflowing to other neighboring subpixels SPXn.

Referring to FIGS. 12 and 13, when the ink INK including the light emitting elements ED is sprayed, the light emitting elements ED are initially aligned between the first electrode layer RME1' and the second electrode layer RME2'.

For example, because the area of the second electrode RME2 is larger than the area of the first electrode RME1, a remanent polarization value Pr of the second electrode RME2 may be larger than a remanent polarization value Pr of the first electrode RME1. Due to the remanent polarization values Pr, a first electric field EF1 is formed between the first electrode RME1 and the second electrode RME2 without the application of an external electric field. A dipole moment is generated in each light emitting element ED by the first electric field EF1 generated between the first electrode RME1 and the second electrode RME2, and the light emitting elements ED may be rotated and aligned by a rotational torque TDEP generated by the dipole moments of the light emitting elements ED. For example, different rotational torques TDEP are applied to both ends of each light emitting element ED due to a difference between the remanent polarization values Pr of both electrodes RME. This facilitates the rotation of the light emitting elements ED, thus making it easy to align the light emitting elements ED between the first electrode RME1 and the second electrode RME2. In addition, the light emitting elements ED are subjected to a dielectrophoretic force FDEP applied by the first electric field EF1, and the light emitting elements ED subjected to the dielectrophoretic force move toward a side having a high electric field strength to gather and settle between the first electrode layer RME1' and the second electrode layer RME2'.

Next, referring to FIGS. 14 through 16, a second electric field EF2 is generated on the electrode layers RME1' and RME2' by transmitting an electrical signal to each electrode layer RME1' or RME2'. Accordingly, the light emitting elements ED are aligned again. In the preceding process, the light emitting elements ED may gather and settle between the first electrode layer RME1' and the second electrode layer RME2', but there may be one or more light emitting elements ED that are not aligned in a desired orientation, meaning that a second semiconductor layer and a light emitting layer of a light emitting element ED is located adjacent to the first electrode layer RME1' while a first semiconductor layer of the light emitting element ED is located adjacent to the second electrode layer RME2'. Therefore, the second electric field EF2 may be formed to orient the light emitting elements ED.

For example, when an electric signal, that is, a current, is supplied to the electrode layers RME1' and RME2', the second electric field EF2 may be generated on the electrode layers RME1' and RME2'. When an alternating current (AC) signal is transmitted to the electrode layers RME1' and RME2', the second electric field EF2 is generated, and thus, the light emitting elements ED dispersed in the ink INK generate dipole moments. The light emitting elements ED in which the dipole moments are generated are aligned by the rotational torque TDEP generated in response to the generated second electric field EF2.

The second electric field EF2 may be formed with different strengths on the first electrode layer RME1' and the second electrode layer RME2'. As illustrated in FIG. 14, the electric field strength is strong on the first electrode layer RME1' due to a narrow gap between field lines and, on the contrary, is weak on the second electrode layer RME2' due to a wide gap between the field lines. Because the first electrode layer RME1' located on the bank pattern BP has a smaller area than the second electrode layer RME2', the electric field strength is strong, and a greater electric field is induced. Conversely, because the second electrode layer RME2' has a larger area than the first electrode layer RME1', the electric field strength is weak, and a weak electric field is induced.

As described above with respect to FIG. 8, in each light emitting element ED, a first semiconductor layer 31 is longer, and a second semiconductor layer 32 is relatively short. Therefore, the mass of a side of each light emitting element ED on which the second semiconductor layer 32 is located may be smaller (e.g., significantly smaller) than the mass of the other side on which the first semiconductor layer 31 is located.

A strong dielectrophoretic force is generated on the first electrode layer RME1' by the generated strong electric field, and on the contrary, a relatively weak dielectrophoretic force is generated on the second electrode layer RME2' by the generated weak electric field. A side of each light emitting element ED, that is, a side having a relatively low mass because the second semiconductor layer 32 is adjacent thereto, receives a greater force from, or is more affected by, a strong magnetic field. That is, the aforementioned side of the light emitting element ED is subjected to a greater acceleration due to its relatively small mass, and is thus attracted onto the first electrode layer RME1'. Consequently, the side of each light emitting element ED to which the second semiconductor layer 32 is adjacent moves onto the first electrode layer RME1' to lie on the first electrode layer RME1'. In contrast, the other side of each light emitting element ED to which the first semiconductor layer 31 is adjacent is located on the second electrode layer RME2'. Therefore, the second semiconductor layer 32 of each light emitting element ED is located on, and adjacent to, the first electrode layer RME1', and the first semiconductor layer 31 of each light emitting element ED is located on, and adjacent to, the second electrode layer RME2'. Consequently, the light emitting elements ED may be aligned in a desired orientation.

Figure 17:
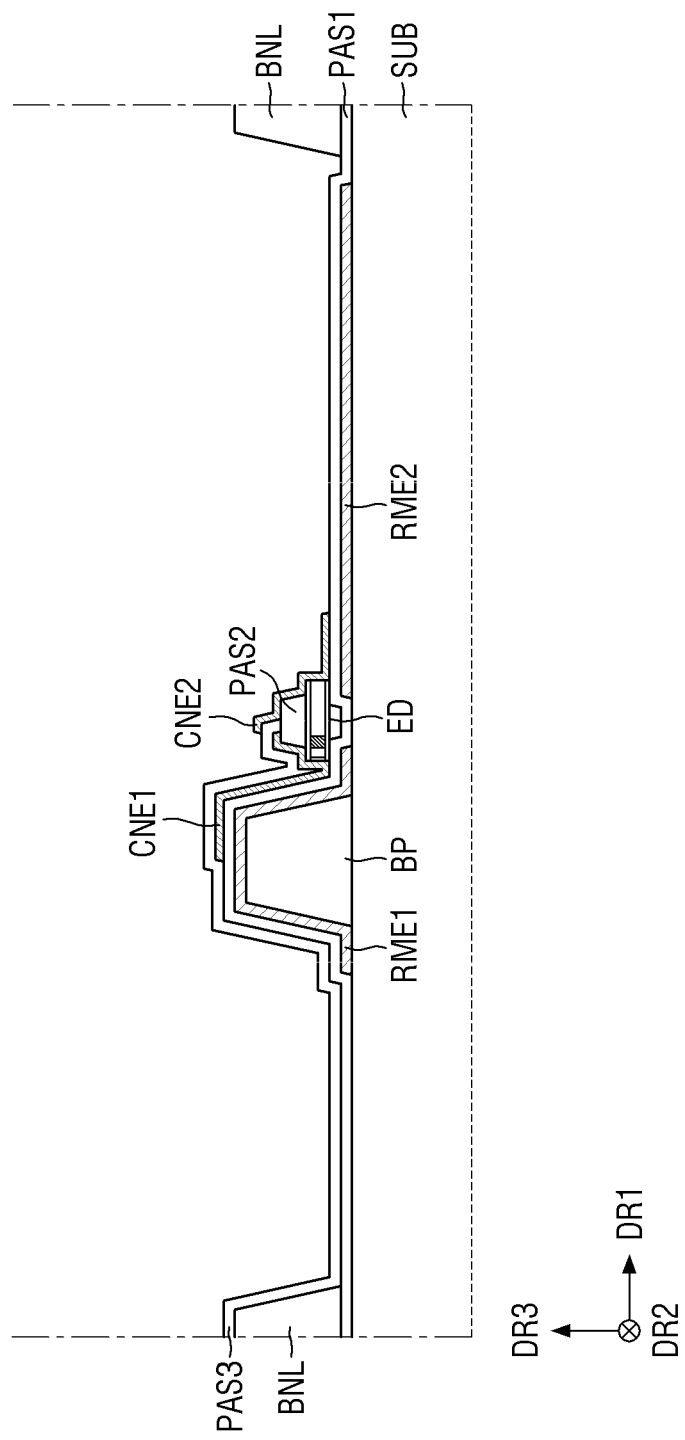

Next, referring to FIG. 17, a second insulating layer PAS2 is formed on the light emitting elements ED. The second insulating layer PAS2 may extend in the second direction DR2 to cover the light emitting elements ED, but may expose both ends of each light emitting element ED. In some embodiments, a process of cutting the first electrode layer RME1' and the second electrode layer RME2' is performed in the sub area to form the first electrode RME1 and the second electrode RME2. Then, a first connection electrode CNE1 is formed on the first insulating layer PAS1 overlapping the first electrode RME1 and on the second insulating layer PAS2. The first connection electrode CNE1 contacts an end of each respective light emitting element ED. Next, a third insulating layer PAS3 is formed on the first connection electrode CNE1. The third insulating layer PAS3 may cover the first connection electrode CNE1 to insulate it from a second connection electrode CNE2 to be formed. Then, the second connection electrode CNE2 is formed on the second insulating layer PAS2 and the third insulating layer PAS3. The second connection electrode CNE2 may overlap the second electrode RME2, and may contact the other end of each light emitting element ED.

The electrode structure of the display device 10 according to some embodiments may be variously changed. Other embodiments of the display device 10 will now be described with further reference to other drawings.

Figure 18:
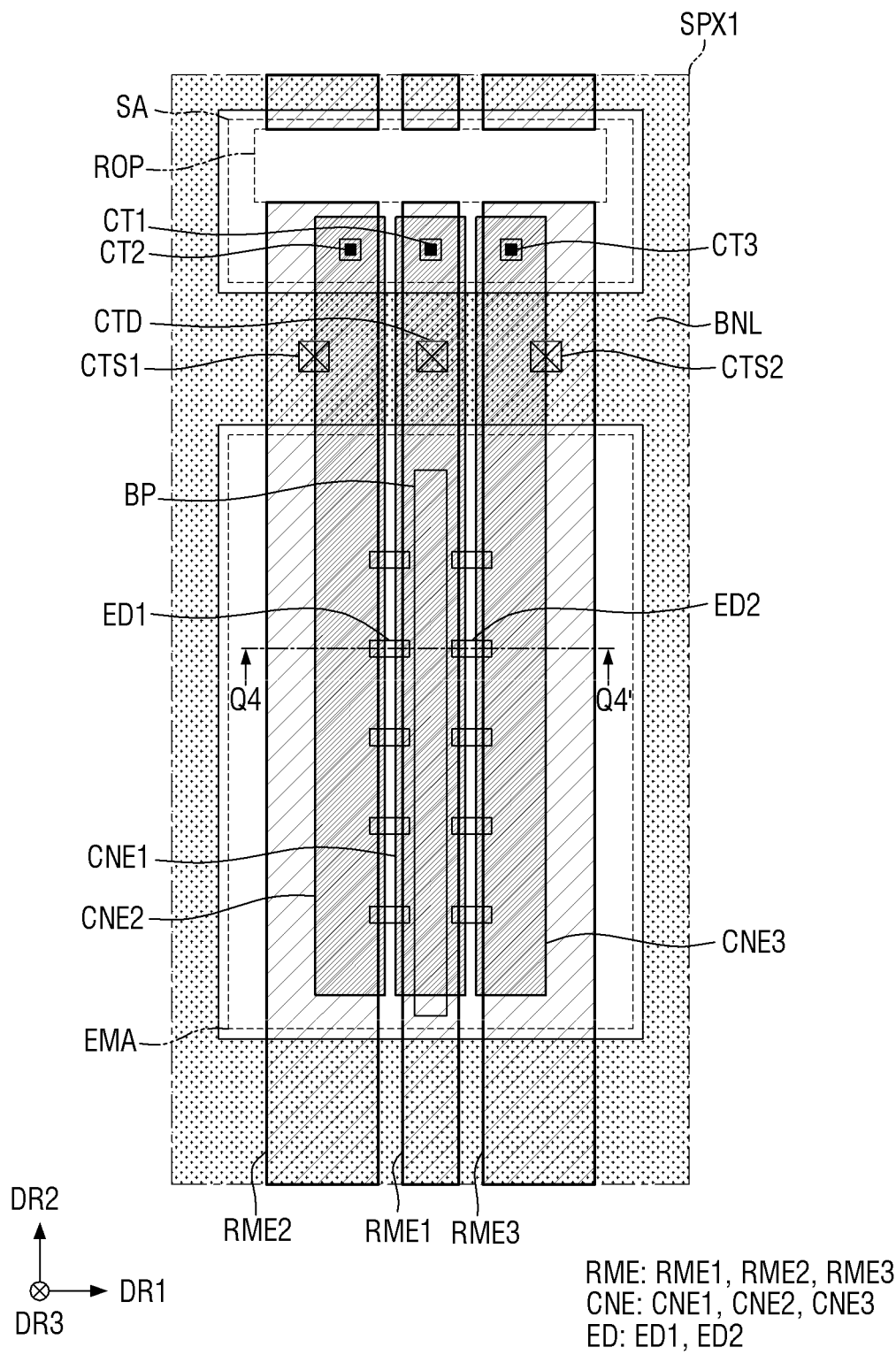
FIG. 18 is a plan view of a subpixel according to some embodiments.
Figure 19:
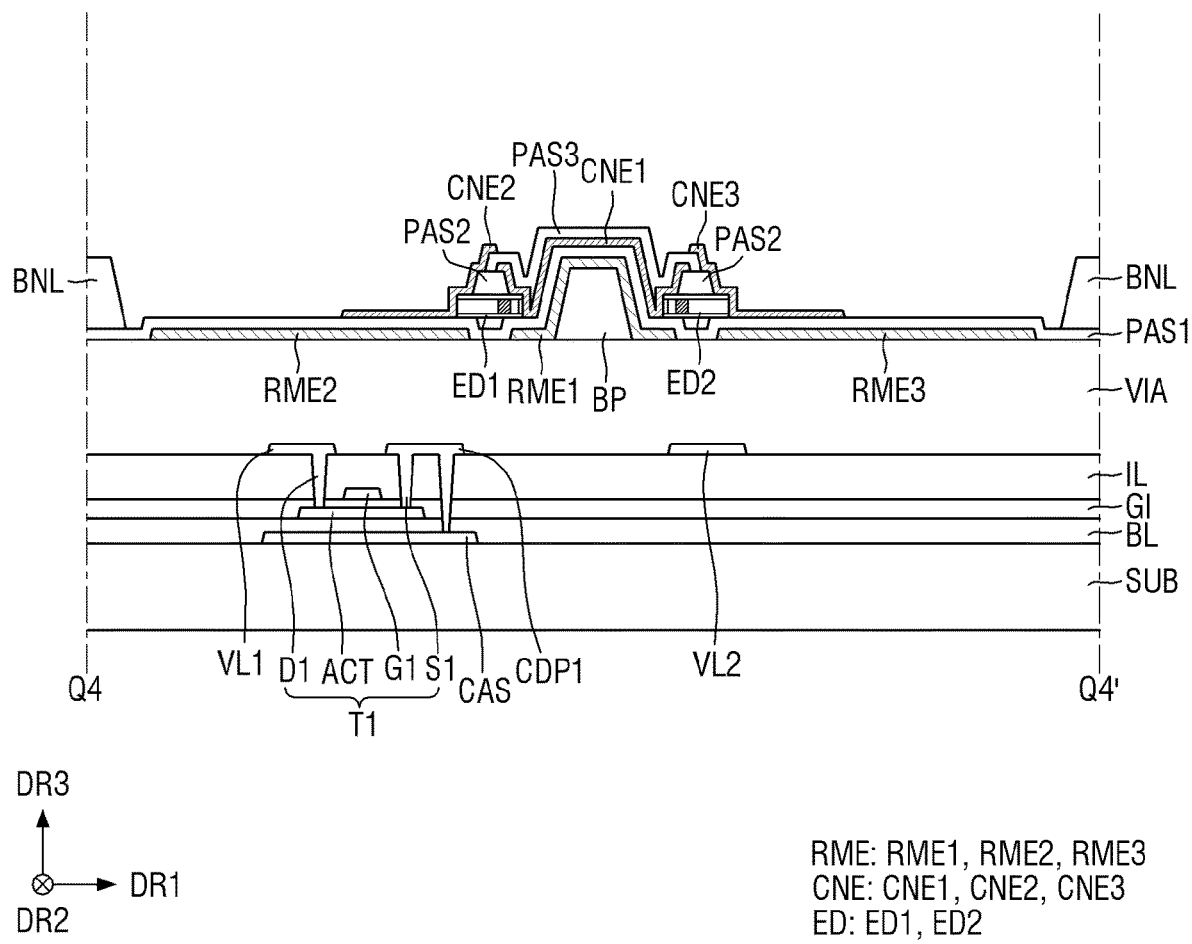
FIG. 19 is a cross-sectional view taken along the line Q4-Q4' of FIG. 18.

FIG. 18 is a plan view of a subpixel SPXn according to some embodiments. FIG. 19 is a cross-sectional view taken along the line Q4-Q4' of FIG. 18.

The following embodiments are different from the above-described embodiments in that they include three electrodes RME and three connection electrodes CNE. A description of the same elements as those of the above-described embodiments and any redundant description will be omitted, and differences and different elements will be described in detail below.

Referring to FIGS. 18 and 19, a bank pattern BP is located on a via layer VIA. The bank pattern BP is located in the center of the subpixel SPXn, and extends in the second direction DR2. A plurality of electrodes RME are located on the via layer VIA. The electrodes RME may include a first electrode RME1 located on the bank pattern BP, a second electrode RME2 located on a side (e.g., a left side) of the first electrode RME1, and a third electrode RME3 located on another side (e.g., a right side) of the first electrode RME1. The second electrode RME2 and the third electrode RME3 may be spaced apart from each other with the first electrode RME1 interposed between them. The first electrode RME1 and the bank pattern BP overlap each other, and the second electrode RME2 and the third electrode RME3 do not overlap the bank pattern BP. A portion of the first electrode RME1 is directly located on the bank pattern BP, but the second electrode RME2 and the third electrode RME3 are directly located on the via layer VIA.

The electrodes RME may be connected to a third conductive layer respectively through a first electrode contact hole CTD, a second electrode contact hole CTS1, and a third electrode contact hole CTS2 formed in a part overlapping a bank layer BNL. The first electrode RME1 may contact a first conductive pattern CDP1 through the first electrode contact hole CTD penetrating the via layer VIA under the first electrode RME1. The second electrode RME2 and the third electrode RME3 may respectively contact a second voltage line VL2 through the second electrode contact hole CTS1 and the third electrode contact hole CTS2 penetrating the via layer VIA under the second electrode RME2 and the third electrode RME3. The first electrode RME1 may be electrically connected to a first transistor T1 through the first conductive pattern CDP1 to receive a first power supply voltage. The second electrode RME2 and the third electrode RME3 may be electrically connected to the second voltage line VL2 to receive a second power supply voltage.

The electrodes RME may be electrically connected to light emitting elements ED through connection electrodes CNE, and may send an electrical signal transmitted to the electrodes RME to the light emitting elements ED through the connection electrodes CNE. In some embodiments, the first electrode RME1 may correspond to anodes of the light emitting elements ED, and the second electrode RME2 and the third electrode RME3 may correspond to cathodes of respective light emitting elements ED. However, the present disclosure is not limited thereto, and the opposite may be the case in other embodiments.

In some embodiments, as described above, the electrodes RME may be made of a ferroelectric, and a width of each of the second electrode RME2 and/or the third electrode RME3 may be greater than that of the first electrode RME1. In some embodiments, each of the width of the second electrode RME2 and the width of the third electrode RME3 may be about 1.5 to about 3 times the width of the first electrode RME1. In addition, the area of each of the second electrode RME2 and the third electrode RME3 may be larger than the area of the first electrode RME1. Accordingly, a remanent polarization value Pr of each of the second electrode RME2 and the third electrode RME3 may be formed to be larger than that of the first electrode RME1, so that the light emitting elements ED can be aligned without the application of an external electric field.

The light emitting elements ED may be located on a first insulating layer PAS1. Some of the light emitting elements ED may be located between the first electrode RME1 and the second electrode RME2, and the others may be located between the first electrode RME1 and the third electrode RME3. According to some embodiments, the light emitting elements ED may include first light emitting elements ED1 located between the first electrode RME1 and the second electrode RME2, and second light emitting elements ED2 located between the first electrode RME1 and the third electrode RME3. The first light emitting elements ED1 may be located on a left side in an emission area EMA of the subpixel SPXn, and the second light emitting elements ED2 may be located adjacent to a right side in the emission area EMA of the subpixel SPXn.

The light emitting elements ED may be electrically connected to the connection electrodes CNE by contacting the connection electrodes CNE. Because semiconductor layers are partially exposed on end surfaces of each light emitting element ED in an extending direction of the light emitting element ED, the exposed semiconductor layers may contact the connection electrodes CNE. A first connection electrode CNE1 may contact an end of each first light emitting element ED1, and a second connection electrode CNE2 may contact the other end. The first connection electrode CNE1 may contact an end of each second light emitting element ED2, and a third connection electrode CNE3 may contact the other end. Each light emitting element ED may be electrically connected to the electrodes RME and the conductive layers under the via layer VIA through the connection electrodes CNE, and may emit light of a specific wavelength band in response to an electrical signal.

The connection electrodes CNE may be located on the light emitting elements ED and the first insulating layer PAS1. The connection electrodes CNE may contact the light emitting elements ED and the electrodes RME. The connection electrodes CNE may directly contact the semiconductor layers exposed on both end surfaces of the light emitting elements ED, and may contact at least any one of the electrodes RME through contact parts CT1 through CT3 penetrating the first insulating layer PAS1 and a second insulating layer PAS2. Both ends of the light emitting elements ED may be electrically connected to the electrodes RME through the connection electrodes CNE.

The first connection electrode CNE1 may extend in the second direction DR2, and may be located on the first electrode RME1 and the bank pattern BP. The first connection electrode CNE1 may extend from the emission area EMA to a sub area SA beyond the bank layer BNL. The first connection electrode CNE1 may contact the first electrode RME1 through a first contact part CT1 exposing the first electrode RME1 in the sub area SA. The first connection electrode CNE1 may contact the light emitting elements ED and the first electrode RME1 to send an electrical signal received from the first transistor T1 to the light emitting elements ED.

The second connection electrode CNE2 may extend in the second direction DR2, and may be located on the second electrode RME2. The second connection electrode CNE2 may extend from the emission area EMA to the sub area SA beyond the bank layer BNL. The second connection electrode CNE2 may contact the second electrode RME2 through a second contact part CT2 exposing the second electrode RME2 in the sub area SA. The second connection electrode CNE2 may contact the first light emitting elements ED1 and the second electrode RME2 to send an electrical signal received from the second voltage line VL2 to the first light emitting elements ED1.

The third connection electrode CNE3 may extend in the second direction DR2, and may be located on the third electrode RME3. The third connection electrode CNE3 may extend from the emission area EMA to the sub area SA beyond the bank layer BNL. The third connection electrode CNE3 may contact the third electrode RME3 through a third contact part CT3 exposing the third electrode RME3 in the sub area SA. The third connection electrode CNE3 may contact the second light emitting elements ED2 and the third electrode RME3 to send an electrical signal received from the second voltage line VL2 to the second light emitting elements ED2.

Figure 20:
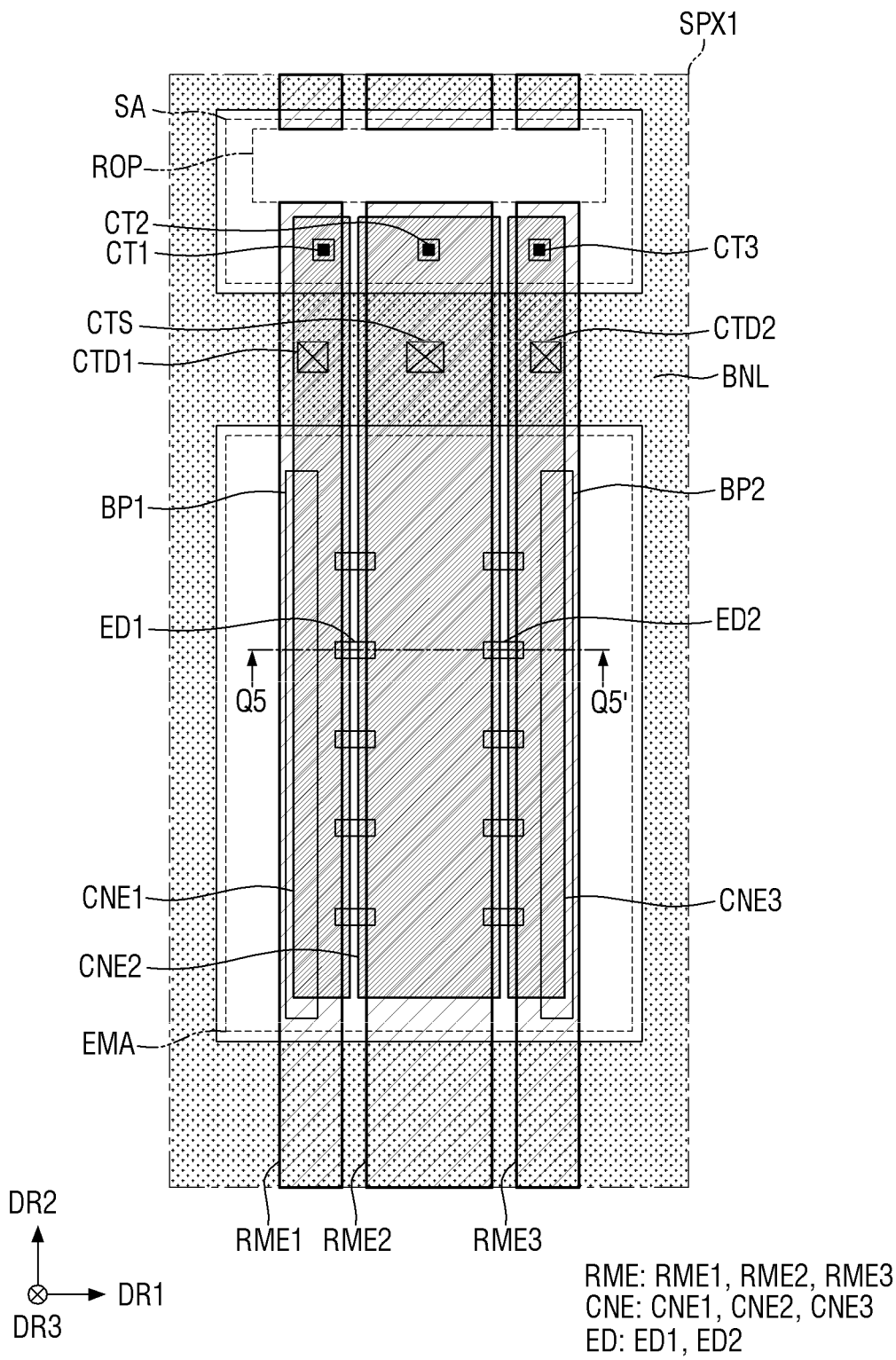
FIG. 20 is a plan view of a subpixel according to some embodiments.
Figure 21:
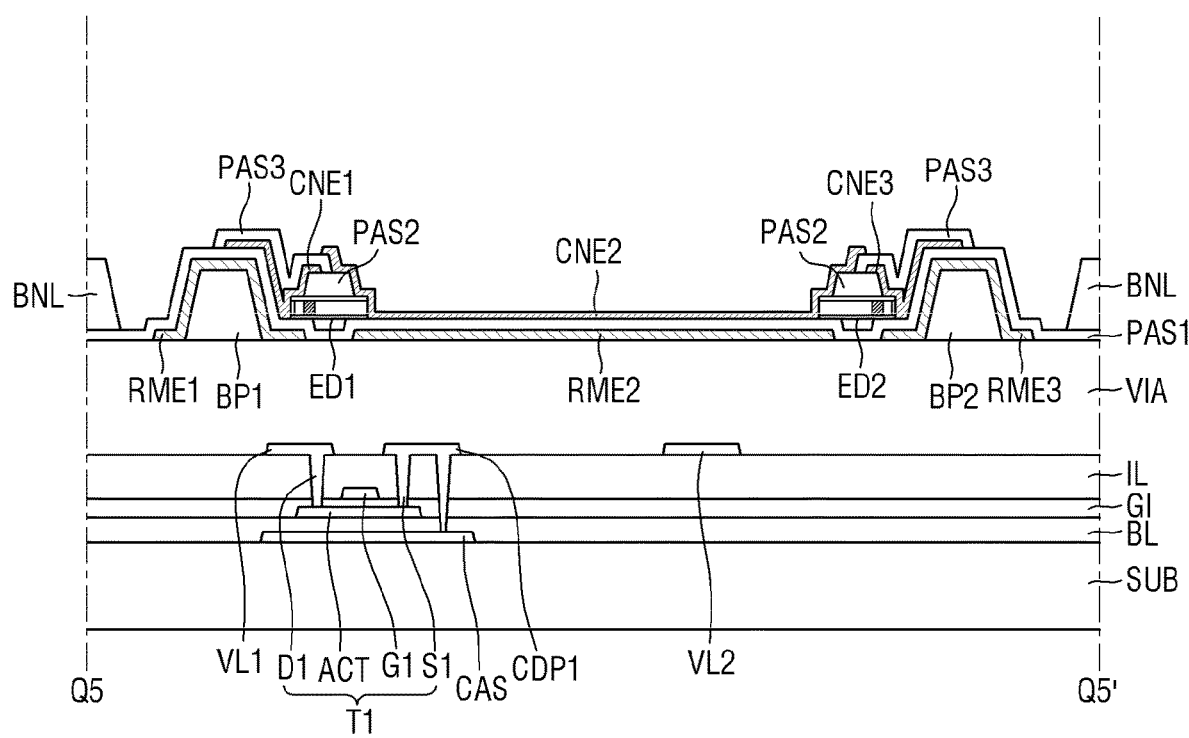
FIG. 21 is a cross-sectional view taken along the line Q5-Q5' of FIG. 20.
Figure 21:
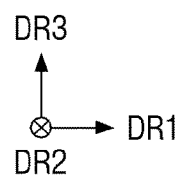

FIG. 20 is a plan view of a subpixel SPXn according to some embodiments. FIG. 21 is a cross-sectional view taken along the line Q5-Q5' of FIG. 20.

The following embodiments are different from the above-described embodiments of FIGS. 18 and 19 in the arrangement of electrodes RME and connection electrodes CNE. Any redundant description will be omitted, and differences and different elements will be described below.

Referring to FIGS. 20 and 21, bank patterns BP are located on a via layer VIA. The bank patterns BP may be spaced apart to face each other in the first direction DR1. In addition, the bank patterns BP may extend in the second direction DR2, and a length of each bank pattern BP may be smaller than a length, in the second direction DR2, of an emission area EMA surrounded by a bank layer BNL. The bank patterns BP may include a first bank pattern BP1 located on a left side of the center of the subpixel SPXn and a second bank pattern BP2 located on a right side. The bank patterns BP may be located in each subpixel SPXn to form island patterns. The bank patterns BP spaced apart to face each other may form an area between them, and in which light emitting elements ED are located.

A plurality of electrodes RME are located on the via layer VIA. The electrodes RME may include a first electrode RME1 located on the first bank pattern BP1, a third electrode RME3 located on the second bank pattern BP2, and a second electrode RME2 located between the first electrode RME1 and the third electrode RME3. The first electrode RME1 and the third electrode RME3 may be spaced apart from each other with the second electrode RME2 interposed between them. The first electrode RME1 and the first bank pattern BP1 may overlap each other, the third electrode RME3 and the second bank pattern BP2 may overlap each other, and the second electrode RME2 might not overlap the bank patterns BP. A portion of the first electrode RME1 is directly located on the first bank pattern BP1, and a portion of the third electrode RME3 is directly located on the second bank pattern BP2. The second electrode RME2 is directly located on the via layer VIA.

The electrodes RME may be connected to a third conductive layer respectively through a first electrode contact hole CTD1, a second electrode contact hole CTS, and a third electrode contact hole CTD2 formed in a part overlapping the bank layer BNL. The first electrode RME1 may contact a first conductive pattern CDP1 through the first electrode contact hole CTD1 penetrating the via layer VIA under the first electrode RME1. The second electrode RME2 may contact a second voltage line VL2 through the second electrode contact hole CTS penetrating the via layer VIA under the second electrode RME2. The third electrode RME3 may contact the first conductive pattern CDP1 through the third electrode contact hole CTD2 penetrating the via layer VIA under the third electrode RME3.

The first electrode RME1 and the third electrode RME3 may be electrically connected to a first transistor T1 through the first conductive pattern CDP1 to receive a first power supply voltage, and the second electrode RME2 may be electrically connected to the second voltage line VL2 to receive a second power supply voltage. The electrodes RME may be electrically connected to the light emitting elements ED through connection electrodes CNE, and may send an electrical signal transmitted to the electrodes RME to the light emitting elements ED through the connection electrodes CNE. In some embodiments, the first electrode RME1 and the third electrode RME3 may correspond to anodes of the light emitting elements ED, and the second electrode RME2 may correspond to cathodes of the light emitting elements ED. However, the present disclosure is not limited thereto, and the opposite may also be the case.

In some embodiments, the electrodes RME may be made of a ferroelectric, and a width of the second electrode RME2 may be greater than a width of each of the first electrode RME1 and the third electrode RME3. In some embodiments, the width of the second electrode RME2 may be about 1.5 to about 3 times the width of each of the first electrode RME1 and the third electrode RME3. In addition, the area of the second electrode RME2 may be larger than the area of each of the first electrode RME1 and the third electrode RME3. Accordingly, a remanent polarization value Pr of the second electrode RME2 may be formed to be larger than a remanent polarization value Pr of each of the first electrode RME1 and the third electrode RME3, so that the light emitting elements ED can be aligned without the application of an external electric field.

Some of the light emitting elements ED may be located between the first electrode RME1 and the second electrode RME2, and the others may be located between the second electrode RME2 and the third electrode RME3. According to some embodiments, the light emitting elements ED may include first light emitting elements ED1 located between the first electrode RME1 and the second electrode RME2 and second light emitting elements ED2 located between the second electrode RME2 and the third electrode RME3. The first light emitting elements ED1 may be located on a left side in the emission area EMA of the subpixel SPXn, and the second light emitting elements ED2 may be located adjacent to a right side in the emission area EMA of the subpixel SPXn.

The light emitting elements ED may be electrically connected to the connection electrodes CNE by contacting the connection electrodes CNE. Because semiconductor layers are partially exposed on end surfaces of each light emitting element ED in an extending direction of the light emitting element ED, the exposed semiconductor layers may contact the connection electrodes CNE. A first connection electrode CNE1 may contact an end of each first light emitting element ED1, and a second connection electrode CNE2 may contact the other end. The second connection electrode CNE2 may contact an end of each second light emitting element ED2, and a third connection electrode CNE3 may contact the other end. Each light emitting element ED may be electrically connected to the electrodes RME and the conductive layers under the via layer VIA through the connection electrodes CNE, and may emit light of a specific wavelength band in response to an electrical signal.

The connection electrodes CNE may be located on the light emitting elements ED and a first insulating layer PAS1. The connection electrodes CNE may contact the light emitting elements ED and the electrodes RME. The connection electrodes CNE may respectively directly contact the semiconductor layers exposed on both end surfaces of the light emitting elements ED, and may contact at least any one of the electrodes RME through contact parts CT1 through CT3 penetrating the first insulating layer PAS1 and a second insulating layer PAS2. Both ends of the light emitting elements ED may be electrically connected to the electrodes RME through the connection electrodes CNE.

The first connection electrode CNE1 may extend in the second direction DR2, and may be located on the first electrode RME1 and the first bank pattern BP1. The first connection electrode CNE1 may contact the first electrode RME1 through a first contact part CT1 exposing the first electrode RME1 in a sub area SA. The first connection electrode CNE1 may contact the first light emitting element ED1, the second light emitting element ED2, and the first electrode RME1 to send an electrical signal received from the first transistor T1 to the first light emitting element ED1 and the second light emitting element ED2.

The second connection electrode CNE2 may extend in the second direction DR2, and may be located on the second electrode RME2. The second connection electrode CNE2 may contact the second electrode RME2 through a second contact part CT2 exposing the second electrode RME2 in the sub area SA. The second connection electrode CNE2 may contact the first light emitting elements ED1 and the second electrode RME2 to send an electrical signal received from the second voltage line VL2 to the first light emitting elements ED1.

The third connection electrode CNE3 may extend in the second direction DR2, and may be located on the third electrode RME3. The third connection electrode CNE3 may contact the third electrode RME3 through a third contact part CT3 exposing the third electrode RME3 in the sub area SA. The third connection electrode CNE3 may contact the second light emitting elements ED2 and the third electrode RME3 to send an electrical signal received from the first transistor T1 to the second light emitting elements ED2.

As described above, in a display device according to embodiments, electrodes are made of a ferroelectric, and a width of at least one electrode is formed to be greater than a width of at least one other electrode. Accordingly, a remanent polarization value of a wide electrode is formed to be larger than a remanent polarization value of a relatively narrow electrode. Thus, light emitting elements can be aligned without the application of an external electric field.

In addition, in a display device according to embodiments, after light emitting elements are initially aligned without the application of an external electric field, they are aligned again by applying an electric field to electrodes. Thus, the degree of alignment of the light emitting elements can be improved.

In addition, in a display device according to embodiments, a bank pattern is formed to overlap a relatively narrow electrode, and a light emitting layer of a light emitting element is placed adjacent to the bank pattern. Thus, it is possible to reflect light emitted from the light emitting element upward, thereby improving light efficiency.

However, the effects of the present disclosure are not restricted to the one set forth herein. The above and other effects of the present disclosure will become more apparent to one of daily skill in the art to which the present disclosure pertains by referencing the claims, with functional equivalents thereof to be included therein.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
a substrate;
a bank pattern extending in a first direction above the substrate;
a first electrode above the bank pattern;
a second electrode above the substrate;
a first insulating layer above the first electrode and the second electrode;
a light emitting element above the first insulating layer, and comprising a first end above the first electrode, and a second end above the second electrode;
a first connection electrode contacting the first end of the light emitting element; and
a second connection electrode contacting the second end of the light emitting element,
wherein the bank pattern overlaps the first electrode and does not overlap the second electrode in a third direction that is perpendicular to the substrate, such that a highest height of the second electrode in the third direction is less than a highest height of the first electrode in the third direction, and
wherein the first electrode and the second electrode comprise a ferroelectric.

2. The display device of claim 1, wherein a width of the second electrode in a second direction crossing the first direction is greater than a width of the first electrode in the second direction.

3. The display device of claim 2, wherein the width of the second electrode is about 1.5 to about 3 times the width of the first electrode.

4. The display device of claim 1, wherein an area of the second electrode is larger than an area of the first electrode.

5. The display device of claim 1, wherein the light emitting element comprises a light emitting layer adjacent to the first electrode.

6. The display device of claim 1, further comprising a via layer between the substrate and the second electrode, wherein an entire lower surface of the second electrode contacts the via layer.

7. The display device of claim 1, wherein the ferroelectric comprises at least one of PZT, SBT, and BLT.

8. A display device comprising:
a substrate;
a first electrode and a second electrode above the substrate, extending lengthwise in a first direction, and spaced apart from each other in a second direction crossing the first direction;
a first insulating layer covering the first electrode and the second electrode;
a light emitting element above the first insulating layer, comprising a first end above the first electrode, and a second end above the second electrode, and extending in the second direction;

a first connection electrode above the first electrode and directly physically contacting the first end of the light emitting element; and a second connection electrode above the second electrode and directly physically contacting the second end of the light emitting element, wherein a width of the second electrode in the second direction is greater than a width of the first electrode in the second direction, and wherein the first electrode and the second electrode comprise a ferroelectric.

9. The display device of claim 8, wherein the width of the second electrode is about 1.5 to about 3 times the width of the first electrode.

10. The display device of claim 8, wherein an area of the second electrode is larger than an area of the first electrode.

11. The display device of claim 8, further comprising a bank pattern between the substrate and the first electrode, and overlapping the first electrode while not overlapping the second electrode in a direction perpendicular to the substrate.

12. The display device of claim 11, wherein the light emitting element comprises a light emitting layer adjacent to the first electrode.

13. The display device of claim 8, wherein the ferroelectric comprises at least one of PZT, SBT, and BLT.

14. A display device comprising:
a first electrode, a second electrode, and a third electrode on a substrate, extending in a first direction, and spaced apart from each other;
a first insulating layer on the first electrode, the second electrode, and the third electrode;
a first light emitting element on the first insulating layer, and comprising a first end on the first electrode, and a second end on the second electrode;
a second light emitting element on the first insulating layer, and comprising a first end on the first electrode and, a second end on the third electrode;
a first connection electrode contacting the first end of the first light emitting element and the first end of the second light emitting element;
a second connection electrode contacting the second end of the first light emitting element; and
a third connection electrode contacting the second end of the second light emitting element,
wherein a width of each of the second electrode and the third electrode in a second direction crossing the first direction is greater than a width of the first electrode in the second direction.

15. The display device of claim 14, wherein the width of each of the second electrode and the third electrode is about 1.5 to about 3 times the width of the first electrode.

16. The display device of claim 14, wherein an area of each of the second electrode and the third electrode is larger than an area of the first electrode.

17. The display device of claim 14, further comprising a bank pattern between the substrate and the first electrode, and overlapping the first electrode while not overlapping the second electrode and the third electrode.

18. The display device of claim 14, wherein each of the first light emitting element and the second light emitting element comprises a light emitting layer adjacent to the first electrode.

19. The display device of claim 14, wherein the first electrode, the second electrode, and the third electrode comprise a ferroelectric comprising at least one of PZT, SBT, and BLT.

* * * * *